United States Patent
Sia et al.

(10) Patent No.: US 12,159,061 B2
(45) Date of Patent: *Dec. 3, 2024

(54) MEMORY SYSTEM INCLUDING A NON-VOLATILE MEMORY CHIP AND METHOD FOR CONTROLLING THE NON-VOLATILE MEMORY CHIP

(71) Applicant: Kioxia Corporation, Tokyo (JP)

(72) Inventors: Marie Sia, Yokohama Kanagawa (JP); Yoshihisa Kojima, Kawasaki Kanagawa (JP); Suguru Nishikawa, Osaka Osaka (JP); Riki Suzuki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 29 days.

This patent is subject to a terminal disclaimer.

(21) Appl. No.: 18/092,158

(22) Filed: Dec. 30, 2022

(65) Prior Publication Data

US 2023/0139665 A1 May 4, 2023

Related U.S. Application Data

(63) Continuation of application No. 17/382,253, filed on Jul. 21, 2021, now Pat. No. 11,573,740, which is a continuation of application No. 16/557,895, filed on Aug. 30, 2019, now Pat. No. 11,099,783.

(30) Foreign Application Priority Data

Mar. 20, 2019 (JP) .................................. 2019-052879

(51) Int. Cl.
*G06F 3/06* (2006.01)
*G11C 11/56* (2006.01)
*G11C 16/04* (2006.01)
*G11C 16/26* (2006.01)

(52) U.S. Cl.
CPC .......... *G06F 3/0659* (2013.01); *G06F 3/0604* (2013.01); *G06F 3/0647* (2013.01); *G06F 3/0679* (2013.01); *G11C 11/5642* (2013.01); *G11C 11/5671* (2013.01); *G11C 16/0483* (2013.01); *G11C 16/26* (2013.01)

(58) Field of Classification Search
None
See application file for complete search history.

(56) References Cited

U.S. PATENT DOCUMENTS

| 6,438,035 B2 | 8/2002 | Yamamoto et al. |
| 6,925,005 B2 | 8/2005 | Kawamura et al. |
| 2006/0224784 A1 | 10/2006 | Nishimoto et al. |
| 2009/0013144 A1 | 1/2009 | Kitamura |

FOREIGN PATENT DOCUMENTS

JP    2004145991 A    5/2004

*Primary Examiner* — Charles J Choi
(74) *Attorney, Agent, or Firm* — Kim & Stewart LLP

(57) ABSTRACT

A memory system includes a non-volatile memory chip that includes a memory cell array, and a memory controller. The memory controller is configured to perform a read operation on the non-volatile memory chip by instructing the non-volatile memory chip to perform a sensing operation to read data stored in the memory cell array, estimating a time when the read data becomes ready to be transferred from the non-volatile memory chip to the memory controller, and instructing the non-volatile memory chip, after the estimated time, to perform a transfer operation to transfer the read data to the memory controller.

20 Claims, 28 Drawing Sheets

FIG. 14 tR TABLE OF TLC METHOD

| READ TYPE / PAGE ADDRESS | L | M | U |
|---|---|---|---|
| FAST READ | 36 μs | 63 μs | 36 μs |
| NORMAL READ | 40 μs | 70 μs | 40 μs |
| DLA READ | 120 μs | 210 μs | 120 μs | tR TABLE OF MLC METHOD

| READ TYPE / PAGE ADDRESS | L | U |
|---|---|---|
| FAST READ | 20 μs | 30 μs |
| NORMAL READ | 25 μs | 35 μs |
| DLA READ | 80 μs | 100 μs | tR TABLE OF SLC METHOD

| READ TYPE | |
|---|---|
| FAST READ | 15 μs |
| NORMAL READ | 20 μs |
| DLA READ | 70 μs |

MEMORY SYSTEM INCLUDING A NON-VOLATILE MEMORY CHIP AND METHOD FOR CONTROLLING THE NON-VOLATILE MEMORY CHIP

CROSS-REFERENCE TO RELATED APPLICATION

This application is a continuation of U.S. patent application Ser. No. 17/382,253, filed Jul. 21, 2021, which is a continuation of U.S. patent application Ser. No. 16/557,895, filed Aug. 30, 2019, now U.S. Pat. No. 11,099,783, issued Aug. 24, 2021, which is based upon and claims the benefit of priority from Japanese Patent Application No. 2019-052879, filed Mar. 20, 2019, the entire contents of which are incorporated herein by reference.

FIELD

Embodiments described herein relate generally to a memory system.

BACKGROUND

A NAND flash memory chip in which memory cells are three-dimensionally stacked is known.

DESCRIPTION OF THE DRAWINGS

FIG. 14 is a table showing read time periods for each storage method.

DETAILED DESCRIPTION

Figure 1:
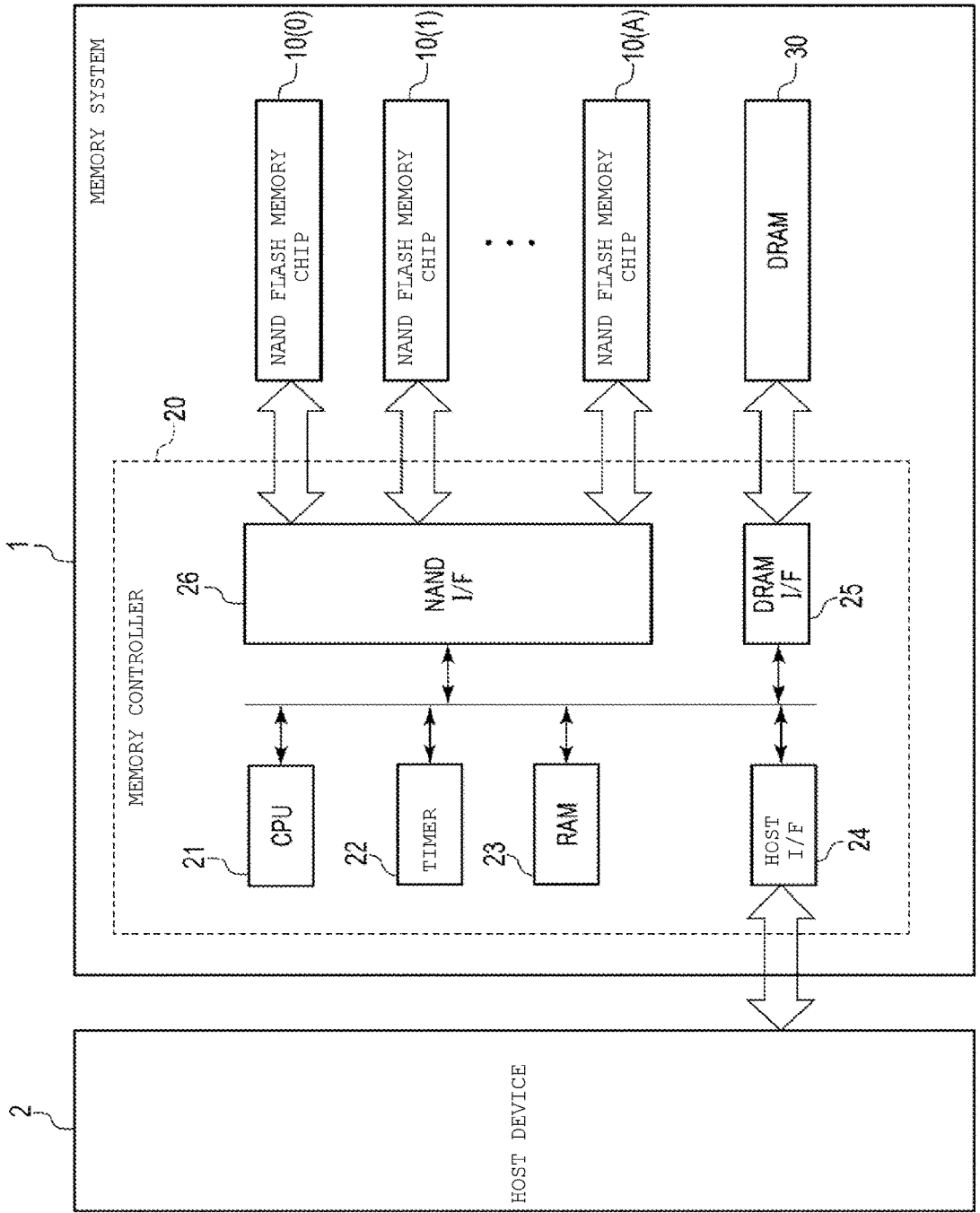
FIG. 1 is a block diagram illustrating a configuration example of a memory system according to a first embodiment.

Embodiments provide a memory system capable of preventing a decrease in operation speed.

In general according to one embodiment, there is provided a memory system including a non-volatile memory chip that includes a memory cell array, and a memory controller that controls the non-volatile memory chip. The memory controller is configured to perform a read operation on the non-volatile memory chip by instructing the non-volatile memory chip to perform a sensing operation to read data stored in the memory cell array, estimating a time when the read data becomes ready to be transferred from the non-volatile memory chip to the memory controller, and instructing the non-volatile memory chip, at or after the estimated time, to perform a transfer operation to transfer the read data to the memory controller.

In the following, embodiments will be described with reference to the drawings. The drawings are schematically illustrated. In the following description, elements having substantially the same function and configuration are denoted by the same reference numerals and redundant descriptions thereof will be avoided. The numbers after the characters that make up the reference numerals and the characters after the numbers that make up the reference numerals are referred to by reference numerals that contain the same character and number, and are used to distinguish between elements having similar configurations. When it is not necessary to distinguish between the elements indicated by the reference numerals including the same character or number, these elements are referred to by the reference numeral including only the same character or the same number.

Further, in the description below, the term "time" is used when referring to a point in time, and the term "time period" is used when referring to a time period between two points in time.

1. First Embodiment

In the following, a memory system according to a first embodiment will be described below.

1-1. Configuration 1-1-1. Configuration of Memory System 1

FIG. 1 is a block diagram illustrating a configuration example of a memory system 1 according to the first embodiment. As illustrated in FIG. 1, the memory system 1 includes a plurality of non-volatile memories (e.g., NAND flash memory chips) 10 (10(0) to 10(A), where A is any integer), a dynamic random access memory (DRAM) 30, and a memory controller 20.

The plurality of NAND flash memory chips 10 are non-volatile memories that store data in a non-volatile manner. The plurality of NAND flash memory chips 10 may operate independently. The number of NAND flash memory chips 10 in the memory system 1 may be designed to be any number. Hereinafter, a NAND flash memory chip will be described as an example of the non-volatile memory 10, which is a non-limiting example and may be any other memory (for example, a magnetoresistive random access memory (MRAM), a phase change random access memory (PCRAM), a resistive random access memory (ReRAM)).

The DRAM 30 is a volatile memory capable of temporarily storing data. A volatile memory in the memory system 1 is not limited to the DRAM. For example, the memory system 1 may include a static random access memory (SRAM) or the like as the volatile memory.

The memory controller 20 is, for example, an integrated circuit (IC) such as a system on a chip (SoC), a field programmable gate array (FPGA), an application specific integrated circuit (ASIC), and may instruct the NAND flash memory chip 10 and the DRAM 30 to perform various operations. The memory controller 20 also executes an operation based on a command from an external host device 2 (referred to herein as the "host command") and an operation not depending on the host command. The configuration of the memory controller 20 will be described later.

1-1-2. Configuration of Memory Controller 20

The configuration of the memory controller 20 will be described with reference to FIG. 1. As illustrated in FIG. 1, the memory controller 20 includes a processor (CPU (central processing unit)) 21, a timer 22, an embedded memory (RAM(random access memory)) 23, a host interface circuit (host I/F) 24, a DRAM interface circuit (DRAM I/F) 25 and a NAND interface circuit (NAND I/F) 26.

The processor 21 controls the overall operation of the memory controller 20. For example, the processor 21 issues a read command in response to a read command received from the host device 2 ("host read command") and transmits the issued command to the NAND interface circuit 26.

The timer 22 may measure time associated with various operations of the memory system 1. The timer 22 may obtain timing information of, for example, a plurality of NAND flash memory chips operating in parallel. Timing information for each NAND flash memory chip may be stored in the embedded memory 23 or the like.

The embedded memory 23 is a storage area used as a work area of the processor 21. For example, the embedded memory 23 stores parameters for managing the NAND flash memory chip 10, various management tables, and the like. For example, the embedded memory 23 stores a command queue of host commands received from the host device 2. The embedded memory 23 stores an address conversion table for converting a logical address associated with data stored in the block BLK into a physical address of the block BLK. This address conversion table is stored, for example, in the NAND flash memory chip 10, read out at the startup of the memory system 1, and stored in the embedded memory 23. As the embedded memory 23, for example, a volatile memory such as a static random access memory (SRAM) is used. When the size of data of the address conversion table is large, the data may be stored in the DRAM 30 whose capacity is larger than that of the embedded memory 23.

The host interface circuit 24 is connected to the host device 2 and manages communication between the memory system 1 and the host device 2. For example, the host interface circuit 24 controls transfer of data, commands, and addresses between the memory system 1 and the host device 2. The host interface circuit 24 supports communication interface standards such as, for example, serial advanced technology attachment (SATA), serial attached SCSI (SAS), PCI express (PCIe®), and non-volatile memory express (NVMe®). Examples of the host device 2 connected to the memory system 1 include a computer including an interface such as SATA, SAS, PCIe, or NVMe.

The DRAM interface circuit 25 is connected to the DRAM 30, and manages communication between the memory controller 20 and the DRAM 30. The DRAM interface circuit 25 is configured based on a DRAM interface standard. The configuration of the DRAM interface circuit 25 is not limited thereto, and may be changed based on a type of volatile memory provided in the memory system 1.

The NAND interface circuit 26 is connected to the NAND flash memory chip 10 and manages communication between the memory controller 20 and the NAND flash memory chip 10. The NAND interface circuit 26 is configured based on a NAND interface standard.

1-1-3. Configuration of NAND Flash Memory Chip 10

Figure 2:
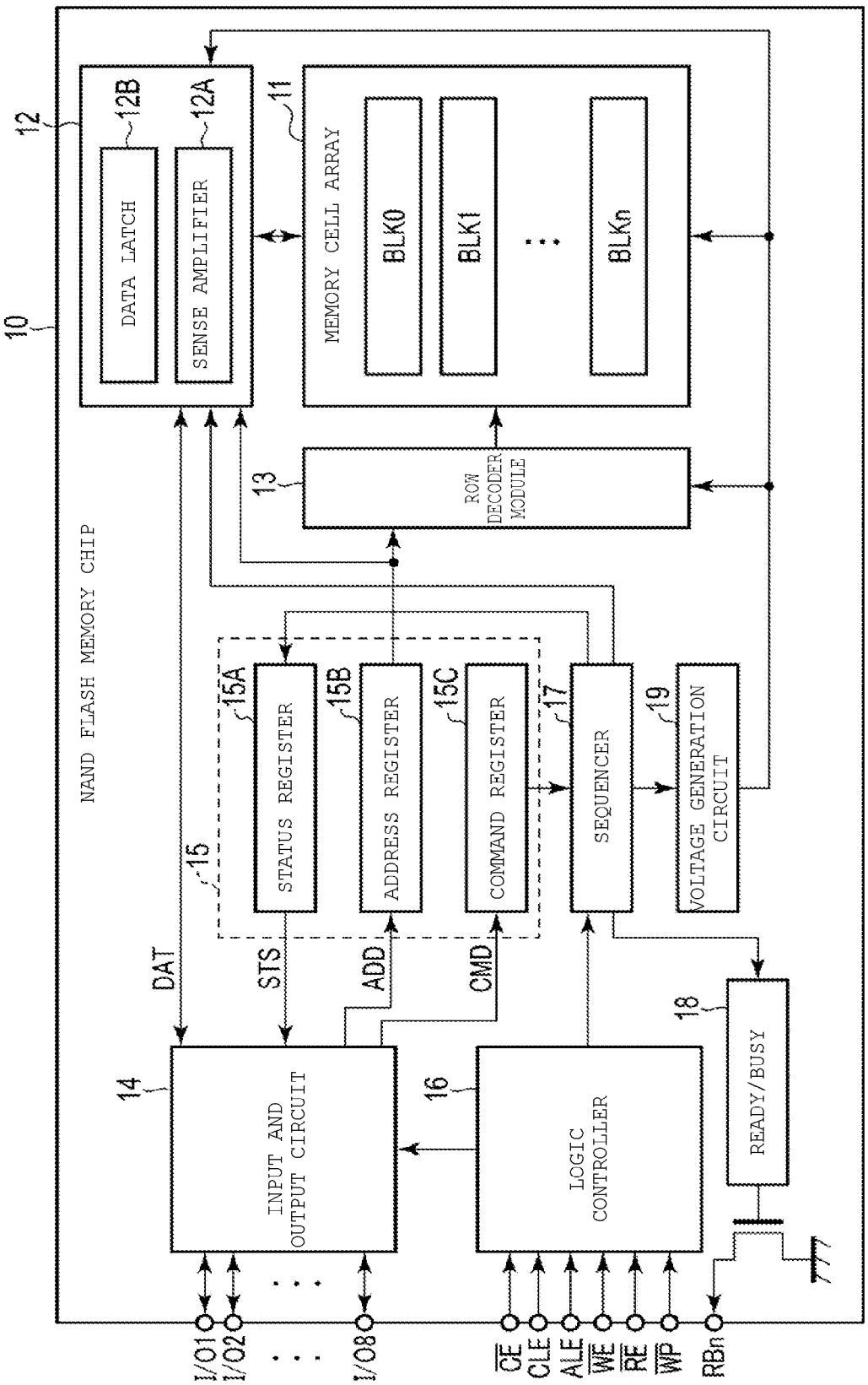
FIG. 2 is a block diagram illustrating a configuration example of a NAND flash memory chip in the first embodiment.

FIG. 2 is a block diagram illustrating a configuration example of the NAND flash memory chip 10 in the first embodiment. As illustrated in FIG. 2, the NAND flash memory chip 10 includes a memory cell array 11, a sense amplifier module 12, a row decoder module 13, an input and output circuit 14, a register 15, a logic controller 16, a sequencer 17, a ready/busy control circuit 18, and a voltage generation circuit 19.

The memory cell array 11 includes blocks BLK0 to BLKn (where n is an integer greater than or equal to 0). The block BLK is a set of a plurality of non-volatile memory cells associated with bit lines and word lines, and is, for example, an erase unit of data. The NAND flash memory chip 10 may store data of 2 bits or more in each memory cell by applying, for example, a multi-level cell (MLC) method or the like.

The sense amplifier module 12 includes a sense amplifier 12A and a data latch 12B. The sense amplifier 12A reads data DAT from the memory cell array 11. The data latch 12B includes a plurality of data latches for temporarily storing data DAT read from the memory cell array 11 or write data DAT received from the memory controller 20 through the input and output circuit 14.

The row decoder module 13 selects a block BLK which is to be subjected to execution of various operations, based on a block address stored in the address register 15B. Then, the row decoder module 13 transfers a voltage supplied from the voltage generation circuit 19 to the selected block BLK.

The input and output circuit 14 transmits and receives an input/output signal to and from the memory controller 20 through, for example, an 8-bit wide input/output bus I/O (I/O1 to I/O8). For example, the input and output circuit 14 transfers write data DAT in the input/output signal received from the memory controller 20 to the data latch 12B, and transmits the read data DAT transferred from the data latch 12B to the memory controller 20 as the input/output signal.

The register 15 includes a status register 15A, an address register 15B, and a command register 15C. The status register 15A stores, for example, status information STS of the sequencer 17, and transfers the status information STS to the input and output circuit 14 based on an instruction of the sequencer 17. The status information STS includes, for example, a start time, a scheduled end time, and an operation time period of a certain operation. The start time, the scheduled end time, and the operation time period described above are represented by, for example, a value of a counter that is counted up according to an internal clock used in the NAND flash memory chip 10. The time between a plurality of different elements such as the memory controller 20 and the NAND flash memory chip 10 is synchronized at any time including the startup time of the memory system 1. The address register 15B stores address information ADD transferred from the input and output circuit 14. For example, a column address and a block address included in the address information ADD are used by the sense amplifier module 12 and the row decoder module 13, respectively. The command register 15C stores a command CMD transferred from the input and output circuit 14.

The logic controller 16 controls the input and output circuit 14 and the sequencer 17 based on various control signals received from the memory controller 20. The control signals include, for example, a chip enable signal /CE, a command latch enable signal CLE, an address latch enable signal ALE, a write enable signal /WE, a read enable signal /RE, and a write protect signal /WP. The signal /CE is a signal for enabling the NAND flash memory chip 10. The signal CLE is a signal for notifying the input and output circuit 14 that a signal input to the NAND flash memory chip 10 is the command CMD. The signal ALE is a signal for notifying the input and output circuit 14 that a signal input to the NAND flash memory chip 10 is the address information ADD. The signals /WE and /RE are, for example, signals instructing the input and output circuit 14 to input and output the input/output signal, respectively. The signal /WP is a signal for putting the NAND flash memory chip 10 in a protected state, for example, when the power is turned ON or OFF.

The sequencer 17 controls the overall operation of the NAND flash memory chip 10 based on the command CMD stored in the command register 15C. For example, the sequencer 17 controls the sense amplifier module 12, the row decoder module 13, the voltage generation circuit 19, and the like to execute various operations such as a write operation and a read operation.

The ready/busy control circuit 18 generates a ready/busy signal RBn based on an operation state of the NAND flash memory chip 10.

Here, the operation state of the NAND flash memory chip 10 will be described. As the operation state of the NAND flash memory chip 10, ready/busy (core ready/busy or true ready/busy) related to a core (memory cell array 11 and sense amplifier module 12) and ready/busy (cache ready/busy) related to cache (data latch 12B) exist.

The core busy state (also described as a true busy state) indicates a state in which access to the sense amplifier module 12 is inhibited or a predetermined operation to the memory cell array 11 is being executed. The predetermined operation is an operation to perform write, read, erase, and the like of data to the memory cell array 11. The core ready state (also described as a true ready state) indicates a state in which access to the sense amplifier module 12 is permitted and the predetermined operation to the memory cell array 11 is not being executed.

The cache busy state indicates that the NAND flash memory chip 10 cannot receive a data transfer command set or a read command set from the memory controller 20 because the data latch 12B is being used. The cache ready state indicates that the NAND flash memory chip 10 may receive the data transfer command set or the read command set from the memory controller 20 because the data latch 12B is not being used.

The ready/busy signal RBn is a signal for notifying the memory controller 20 whether the NAND flash memory chip 10 is in a ready state in which state a controller command can be received from the memory controller 20 or in a busy state in which state the controller command cannot be received. A controller command for reading data of the status register 15A, which will be described later, may be received even if the NAND flash memory chip 10 is in a busy state.

During execution of a cache program or a cache read operation, the ready/busy signal RBn generated in the ready/busy control circuit 18 does not indicate the true busy state of the core (that is, the core busy state) or the true ready state of the core (that is, the core ready state), and instead indicates a cache ready/busy state. For that reason, cache ready/cache busy in the ready/busy signal RBn does not necessarily coincide with core ready/core busy.

The voltage generation circuit 19 generates a desired voltage based on control of the sequencer 17 and supplies the generated voltage to the memory cell array 11, the sense amplifier module 12, the row decoder module 13, and the like. For example, based on a page address stored in the address register 15B, the voltage generation circuit 19 applies a desired voltage to each of a signal line corresponding to the selected word line and a signal line corresponding to the non-selected word line.

1-1-4. Configuration of Memory Cell Array 11

Figure 3:
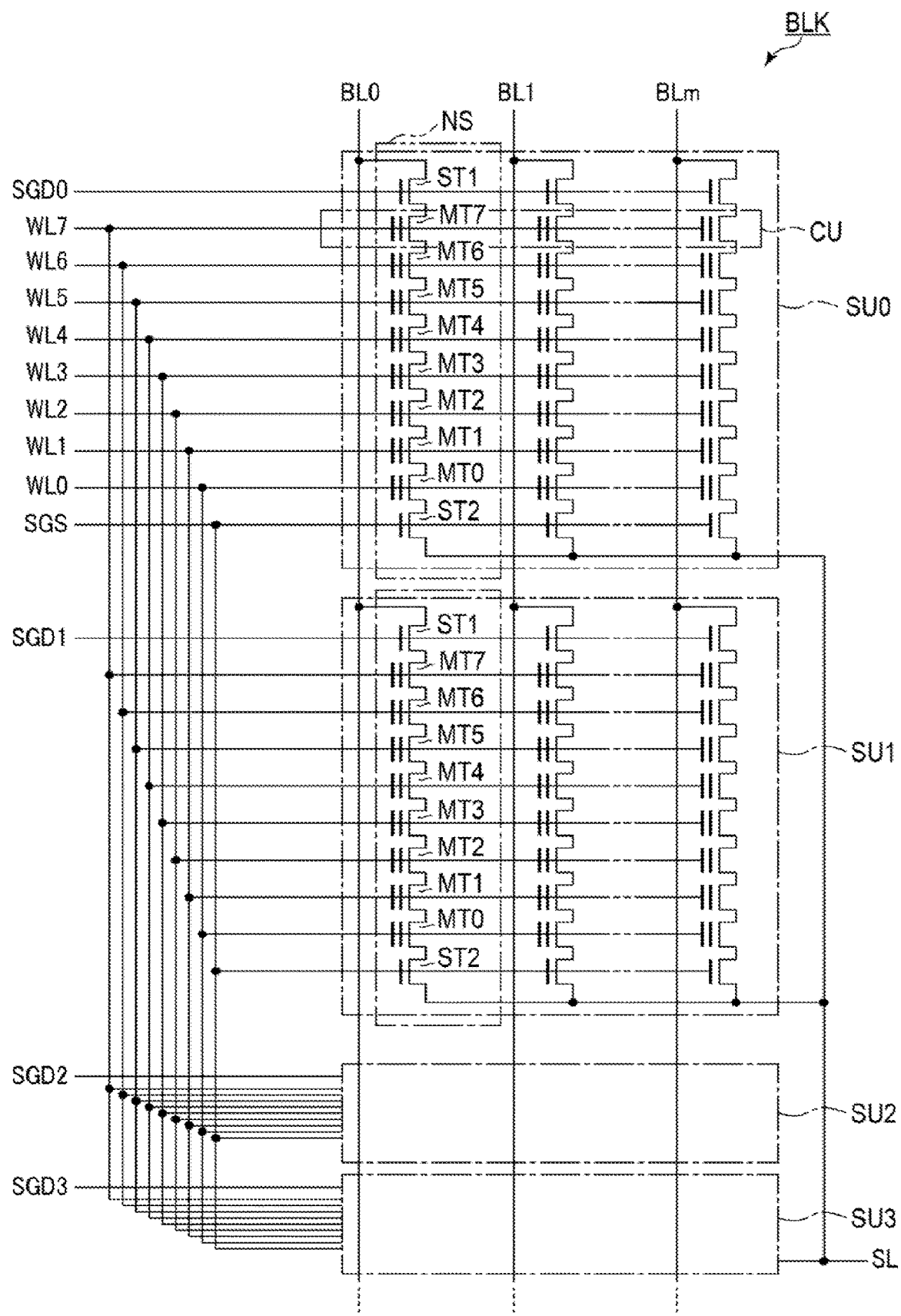
FIG. 3 is a circuit diagram of one block in a memory cell array of the NAND flash memory chip in the first embodiment.

FIG. 3 is a circuit diagram illustrating a configuration example of the memory cell array 11 in the NAND flash memory chip 10 in the first embodiment, and illustrates a detailed circuit configuration of one block BLK in the memory cell array 11. In the example illustrated in FIG. 3, the block BLK includes four string units SU0 to SU3.

Each string unit SU includes a plurality of NAND strings NS each associated with bit lines BL0 to BLm (m is an integer greater than or equal to 0). Each NAND string NS includes, for example, memory cell transistors MT0 to MT7 and select transistors ST1 and ST2.

Each memory cell transistor MT includes a control gate and a charge storage layer, and stores data in a non-volatile manner. The memory cell transistors MT0 to MT7 in each NAND string NS are connected in series between a source of the select transistor ST1 and a drain of the select transistor ST2. Control gates of the memory cell transistors MT0 of the NAND strings NS in the same block BLK are commonly connected to a word line WL0. Similarly, control gates of the memory cell transistors MT1 to MT7 of the plurality of NAND strings NS in the same block BLK are commonly connected to word lines WL1 to WL7, respectively. In the following description, a plurality of memory cell transistors MT connected to a common word line WL in each string unit SU will be referred to as a cell unit (CU). The set of 1-bit data stored per memory cell transistor in the cell unit is referred to as a "page". Accordingly, when 2-bit data is stored per memory cell transistor MT, the cell unit stores two pages of data.

The select transistors ST1 and ST2 are used to select the string unit SU during various operations. Drains of the select transistors ST1 in the NAND string NS corresponding to the same column address are commonly connected to the corresponding bit line BL. Gates of the plurality of select transistors ST1 in the string unit SU0 are commonly connected to a select gate line SGD0. Similarly, gates of the plurality of select transistors ST1 in the string unit SU1 to SU3 are commonly connected to select gate lines SGD1 to SGD3, respectively. In the same block BLK, sources of the plurality of select transistors ST2 are commonly connected to one source line SL, and the gates of the plurality of select transistors ST2 are commonly connected to one select gate line SGS.

In the circuit configuration of the memory cell array 11 described above, the word lines WL0 to WL7 are provided for each block BLK. The bit lines BL0 to BLm are shared among a plurality of blocks BLK. The source line SL is shared among the plurality of blocks BLK. The number of string units SU in each block BLK described above and the number of memory cell transistors MT and select transistors ST1 and ST2 in each NAND string NS are merely given as an example, and the number of the string units and transistors may be designed to be any number. The number of word lines WL and select gate lines SGD and SGS is changed based on the number of memory cell transistors MT and select transistors ST1 and ST2.

Figure 4:
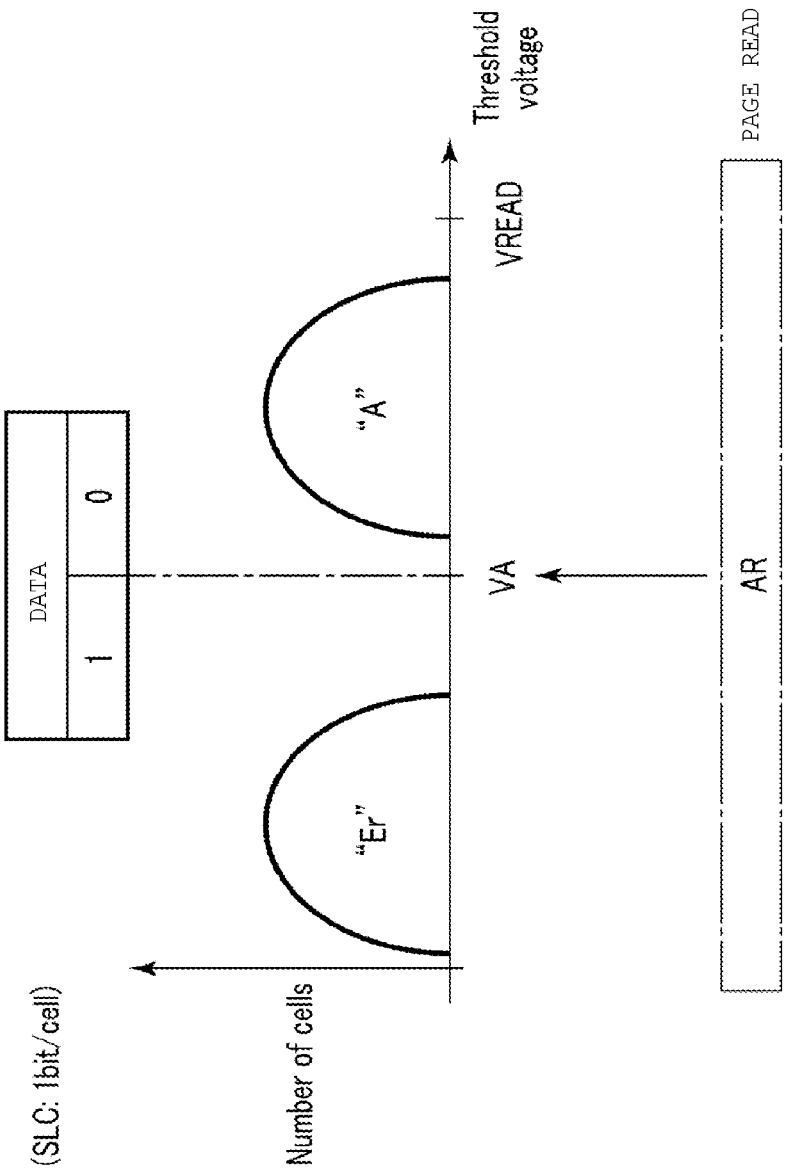
FIG. 4 illustrates a threshold voltage distribution and a read voltage of a memory cell transistor MT when one memory cell transistor MT stores 1-bit data.
Figure 5:
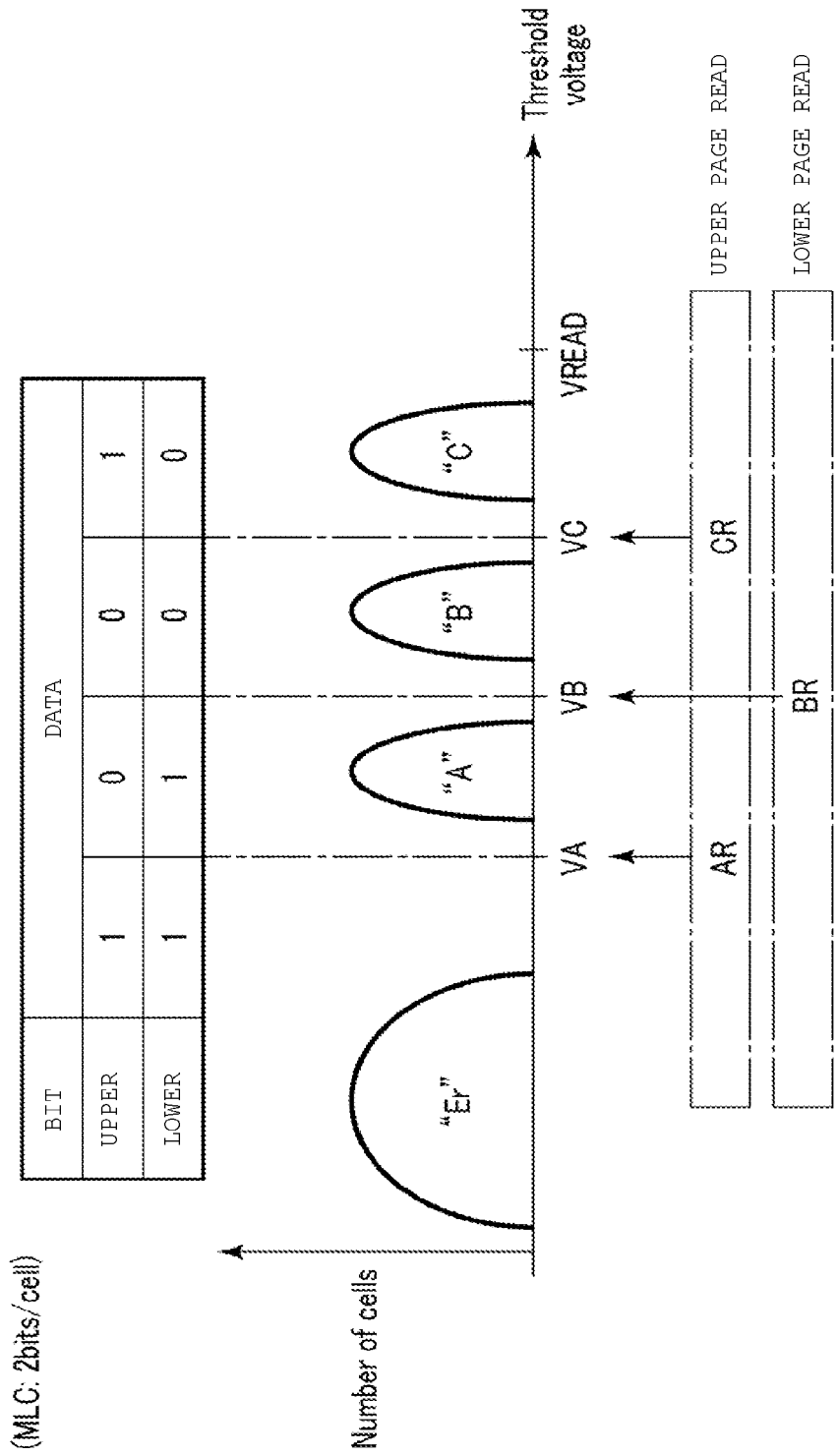
FIG. 5 illustrates a threshold voltage distribution and a read voltage of the memory cell transistor MT when one memory cell transistor MT stores 2-bit data.
Figure 6:
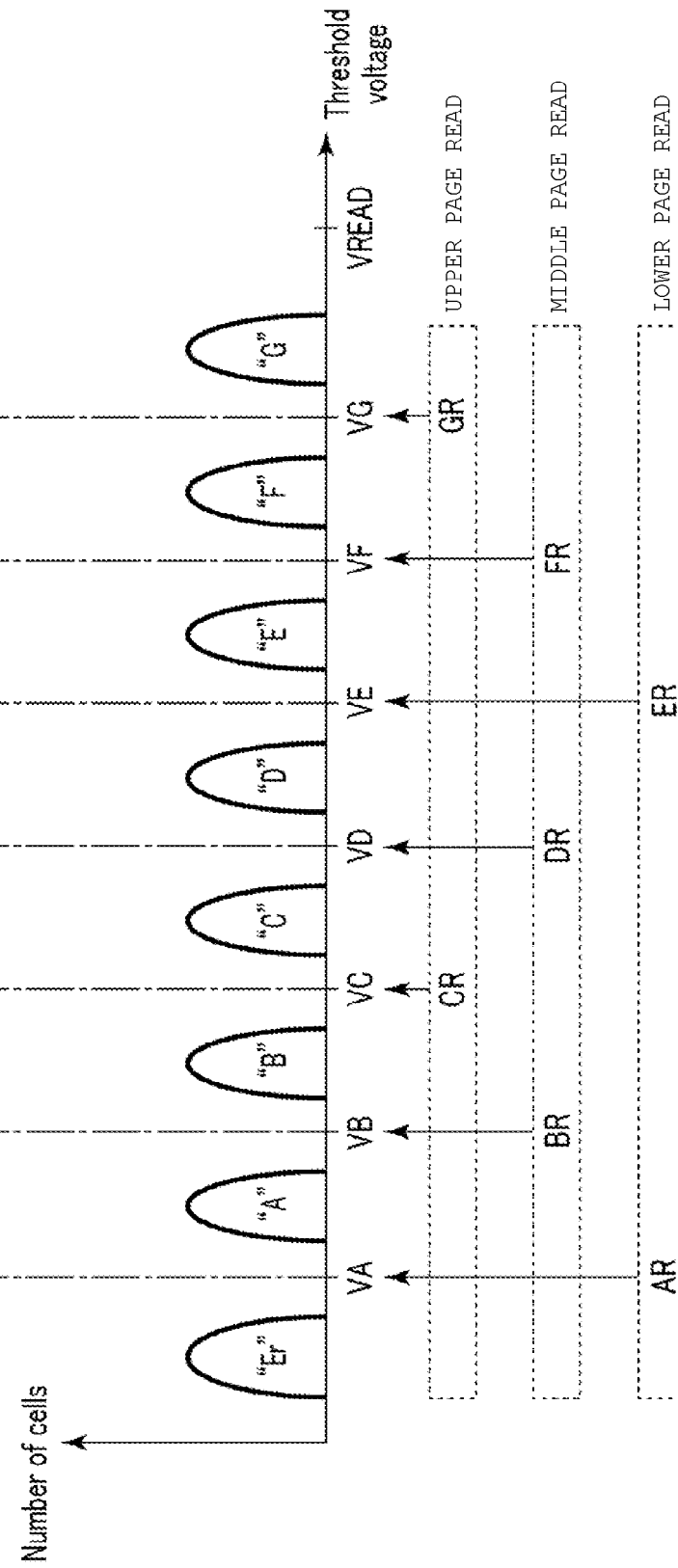
FIG. 6 illustrates a threshold voltage distribution and a read voltage of the memory cell transistor MT when one memory cell transistor MT stores 3-bit data

Threshold voltage distributions formed by the threshold voltages of the plurality of memory cell transistors MT of the memory cell array 11 is, for example, as illustrated in FIG. 4 to FIG. 6. FIG. 4 to FIG. 6 illustrate threshold voltage distributions and read voltages of the memory cell transistors MT when each memory cell transistor MT stores 1-bit data, 2-bit data, or 3-bit data, and in FIG. 4 to FIG. 6, the vertical axis corresponds to the number of memory cell transistors MT, and the horizontal axis corresponds to the threshold voltage Vth of the memory cell transistors MT. As illustrated in FIG. 4 to FIG. 6, the plurality of memory cell transistors MT form a plurality of threshold voltage distributions based on the number of bits of data to be stored. In the following, as an example of a write method, a single-level cell (SLC) method for storing 1-bit data in one memory cell transistor MT, a multi-level cell (MLC) method for storing 2-bit data in one memory cell transistor MT, and a triple-level cell (TLC) method for storing 3-bit data in one memory cell transistor MT will be described.

As illustrated in FIG. 4, in the case of the SLC method, the plurality of memory cell transistors MT form two threshold voltage distributions. The two threshold voltage distributions are referred to as an "Er" state and an "A" state in order from the lowest threshold voltage. In the SLC method, for example, "1" data and "0" data are allocated to the "Er" state and the "A" state, respectively.

As illustrated in FIG. 5, in the case of the MLC method, the plurality of memory cell transistors MT form four threshold voltage distributions. The four threshold voltage distributions are referred to as the "Er" state, the "A" state, a "B" state, and a "C" state in order from the lowest threshold voltage. In the MLC method, for example, "11 (Upper/lower)" data, "10" data, "00" data, and "01" data are allocated to the "Er" state, the "A" state, the "B" state, and the "C" state, respectively.

As illustrated in FIG. 6, in the case of the TLC method, the plurality of memory cell transistors MT form eight threshold voltage distributions. The eight threshold voltage distributions are referred to as the "Er" state, the "A" state, the "B" state, the "C" state, a "D" state, an "E" state, an "F" state", a "G state" in order from the lowest threshold voltage. In the TLC method, for example, "111 (Upper/Middle/Lower)" data, "110" data, "100" data, "000" data, "010" data, "011" data, "001" data, and "101" data are allocated to the "Er" state, "A" state, "B" state, "C" state, "D" state, "E" state, "F" state, and "G" state, respectively.

In the threshold voltage distributions described above, the read voltages are set between the adjacent threshold voltage distributions, respectively. For example, a read voltage AR is set between the highest threshold voltage in the "Er" state and the lowest threshold voltage in the "A" state, and is used to determine whether the threshold voltage of the memory cell transistor MT falls within the threshold voltage distribution of the "Er" state or in a threshold voltage distribution of the "A" state or more. When the read voltage AR is applied to the memory cell transistor MT, the memory cell transistor corresponding to the "Er" state is turned to an ON state, and the memory cell transistors corresponding to the "A" state, the "B" state, the "C" state, the "D" state, the "E" state, the "F" state, and the "G" state are turned to an OFF state. Other read voltages are also similarly set. A read voltage BR is set between the threshold voltage distribution of the "A" state and the threshold voltage distribution of the "B" state, and the read voltage CR is set between the threshold voltage distribution of the "B" state and the threshold voltage of the "C" state. A read voltage DR is set between the threshold voltage distribution of the "C" state and the threshold voltage distribution of the "D" state, and a read voltage ER is set between the threshold voltage distribution of the "D" state and the threshold voltage of the "E" state. A read voltage FR is set between the threshold voltage distribution of the "E" state and the threshold voltage distribution of the "F" state, and a read voltage GR is set between the threshold voltage distribution of the "F" state and the threshold voltage distribution of the "G" state. In each write method, a read pass voltage VREAD is set to a voltage higher than the highest threshold voltage in the threshold voltage distribution with the highest threshold voltage. That is, the memory cell transistor MT for which the read pass voltage VREAD is applied to the gate thereof is turned ON regardless of data stored therein.

The number of bits of data stored in one memory cell transistor MT described above and allocation of data to the threshold voltage distribution of the memory cell transistor MT are merely given as examples. Various other data allocations may be applied to the threshold voltage distribution. Each read voltage and read pass voltage may be set to the same voltage value in each method, or may be set to different voltage values.

The sense time period required for each of the SLC method, MLC method, and TLC method described above is different. One read level is used in lower page read of the SLC method and MLC method, two read levels are used in upper page read of the MLC method and upper page read and lower page read of the TLC, and three read levels are used in middle page read of the TLC method. Thus, as the read level used for reading increases, the sense time period also increases. For example, when one read level is used, a sense time period tR is 30 μs, when two read levels are used, the sense time period tR is 50 μs, and when three read levels are used, the sense time period tR is 70 μs. Thus, the difference in the number of read levels used to read each page greatly affects the difference in the sense time period tR. Specifically, in the MLC method, the sense time period of lower page read is shorter than the sense time period of upper page read. In the TLC method, the sense time period of the lower page read is almost the same as the sense time of the upper page read, and the sense time period of the middle page read is longer than the sense time period for reading other pages. As a margin of the threshold voltage distribution between adjacent states is smaller (TLC method and the like), the sense time period is more susceptible to the influence of noise and the like and thus, the sense time period tends to be longer. Specifically, since the margin between states in the SLC method is greater than that of the MLC method which is greater than that of the TLC method, the time period taken for one read level in the SLC method is less than that of the MLC method which is less than that of the TLC method. Encoding of bit allocation of the lower page/upper page of the MLC method illustrated here is given only as an example. Similarly, encoding of bit allocation of the lower page/middle page/upper page of the TLC method illustrated here is given only as an example. For that reason, other encodings are also applicable. In such a case, the magnitude relationship of the sense time period between pages would also be different.

For example, as illustrated in FIG. 4, the read pass voltage VREAD in the MLC system is set higher than the read pass voltage VREAD in the SLC system. Similarly, the read pass voltage VREAD in the TLC method is set higher than the read pass voltage VREAD in the MLC method.

The configuration of the memory cell array 11 described above may be another configuration. Descriptions of such other configurations of the memory cell array 11 are provided in, for example, U.S. patent application Ser. No. 12/407,403, filed on Mar. 19, 2009, and entitled "Three-Dimensional Stacked Nonvolatile Semiconductor Memory," U.S. patent application Ser. No. 12/406,524, filed on Mar. 18, 2009, and entitled "Three-Dimensional Stacked Non-Volatile Semiconductor Memory," U.S. patent application Ser. No. 12/679,991, filed on Mar. 25, 2010, and entitled "Non-Volatile Semiconductor Memory Device and Method of Manufacturing the Same," and U.S. patent application Ser. No. 12/532,030, filed on Mar. 23, 2009 and entitled "Semiconductor Memory and Method of Manufacturing the Same." These patent applications are incorporated herein by reference in their entirety.

1-2. Operation 1-2-1. Basic of Read Operation

First, the basic steps of a read operation will be described with reference to FIGS. 7 and 8.

The read operation roughly includes two operations of a sensing operation and a data transfer operation.

Figure 7:
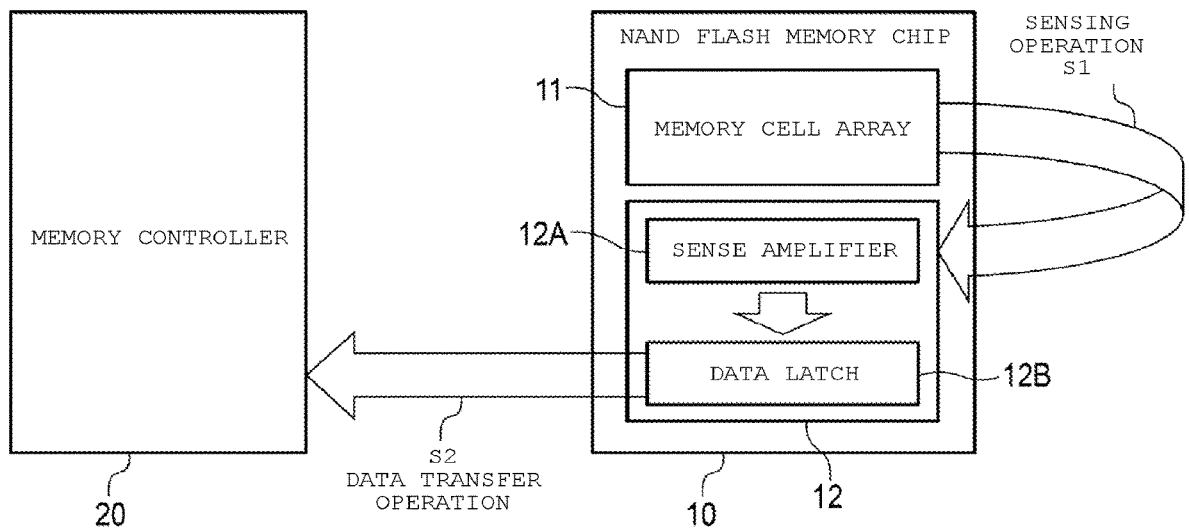
FIG. 7 is a conceptual diagram illustrating basic steps of a read operation.

As illustrated in FIG. 7, the sensing operation is an operation in which the sense amplifier module 12 reads data stored in the memory cell array 11. Specifically, the sequencer 17 applies a read voltage (of a particular read level) to a read target word line and applies the read pass voltage VREAD to a non-target word line. Then, the sense amplifier 12A senses the current flowing in the bit line. If the sense amplifier 12A senses that a current flows through the bit line, the sequencer 17 determines that data stored in the cell when the sense amplifier performs reading based on the read voltage is 1 (one) data (i.e., the threshold voltage of the cell is less than or equal to the read level) and if the sense amplifier 12A senses that the current does not flow through the bit line, the sequencer 17 determines that the data stored in the cell when the sense amplifier performs reading based on the read voltage is 0 (zero) data (i.e., the threshold voltage of the cell is greater than the read level). The sequencer 17 repeats this operation a number of times equal to the number of read levels necessary for a type of a read target page (either of lower, middle, and upper) and performs a logic operation in the data latch 12B, thereby capable of obtaining page data.

The data transfer operation is an operation of transferring data read by the sense amplifier module 12 to the memory controller 20 through the input/output bus.

Figure 8:
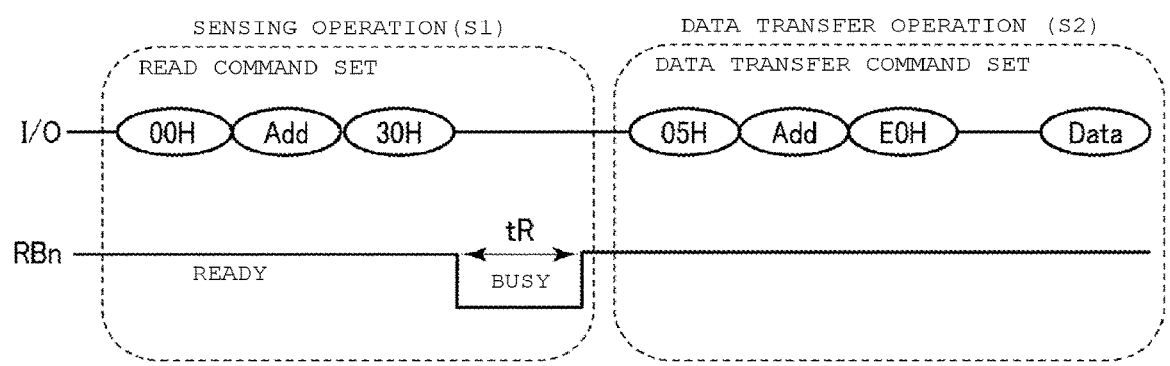
FIG. 8 is a diagram illustrating a command set of the read operation.

As illustrated in FIG. 8, when a command (00H, 30H) and an address (column address and row address) for reading are received from the memory controller 20, the NAND flash memory chip 10 starts a sensing operation (S1). The set of read command and address is also described as a read command set. Issuing the read command set is also described as a sense request. When the sensing operation (S1) is stared, the NAND flash memory chip 10 transitions to a core busy state, and as a result, transitions the ready/busy signal RBn from the cache ready state to the cache busy state. When the ready/busy signal RBn is in the cache busy state, the NAND flash memory chip 10 cannot receive a command related to the data transfer operation from the memory controller 20. For that reason, when instructing the data transfer operation, the memory controller 20 needs to issue a data transfer operation command after the sensing operation is ended and the ready/busy signal RBn transitions to the cache ready state. The NAND flash memory chip 10 may transfer data sensed by the completed read command to the memory controller 20 even in the core busy state due to the sensing operation of another read command following the completed read command. Such an operation is called a cache operation. The NAND flash memory chip 10 may execute this cache operation if the sensing operation is completed and the page data is stored in the data latch 12B.

When the NAND flash memory chip 10 ends the sensing operation, the NAND flash memory chip 10 transitions to the core ready state, and as a result, the ready/busy signal RBn is changed from the busy state to the ready state. The memory controller 20 determines that the NAND flash memory chip 10 is in the ready state by checking the status of the ready/busy signal RBn, or issuing a status read command and acquiring the status (information indicating core ready/core busy) of the NAND flash memory chip 10 by the memory controller 20. The memory controller 20 issues a command (05H, E0H) and an address related to data transfer to the NAND flash memory chip 10 so as to perform the data transfer (data out) operation. The set of the command and address related to data transfer is also described as a data transfer command set. Issuing the data transfer command set is also described as a data transfer request. When the data transfer command set is received, the NAND flash memory chip 10 performs data transfer operation (S2), and transfers read data (Data) to the memory controller 20 through the input/output bus.

In order to exhibit high read performance, it is necessary for the memory controller 20 to detect completion of the sensing operation of the NAND flash memory chip 10 without delay and to start the data transfer operation as soon as possible.

For example, two methods for detecting the completion of the sensing operation may be considered.

Completion Detection Method 1

The first completion detection method is a method in which the memory controller 20 monitors change in the ready/busy signal of the NAND flash memory chip 10.

Completion Detection Method 2

The second completion detection method is a method in which the memory controller 20 performs polling using a status read command.

In the following, problems that may occur when the two completion detection methods are adopted will be described.

1-2-1-1. Problems that can Occur when Completion Detection Method 1 is Adopted.

In the following, problems that may occur when the completion detection method 1 is adopted will be described.

1-2-1-1-1. Individual Wiring

When transmitting and receiving of a ready/busy signal is performed between the NAND flash memory chip 10 and the memory controller 20, two methods of wiring to transmit and receive the ready/busy signals may be considered.

Figure 9:
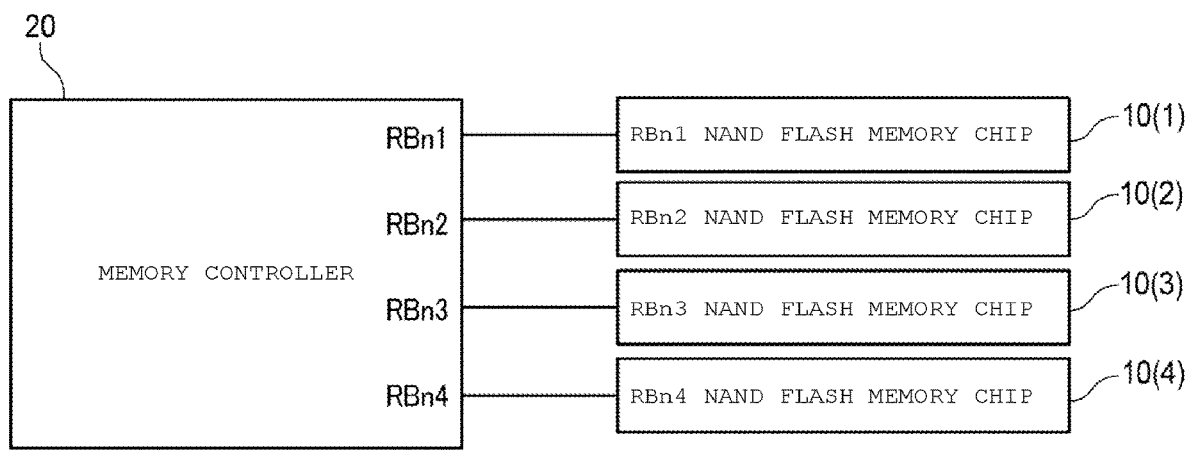
FIG. 9 is a diagram illustrating a connection relationship between a NAND flash memory chip and a memory controller.

As one of the wiring methods, as illustrated in FIG. 9, the individual wiring in which the wiring of one ready/busy signal and one ready/busy pin (pin to which the ready/busy signal wiring is connected) of the memory controller 20 are used for one NAND flash memory chip 10 may be considered. For example, when four NAND flash memory chips 10 are connected to the memory controller 20, it is necessary to prepare four ready/busy signals RBn1 to RBn4 and provide wirings of four ready/busy signals and four ready/busy signal pins.

When the completion detection method 1 is adopted, the memory controller 20 can know switching between ready/busy states of the NAND flash memory chip 10 without delay. However, in the case of adopting such individual wiring, when the number of NAND flash memory chips 10 increases, the number of wirings of the ready/busy signal and the number of ready/busy pins increase. With this configuration, there is a problem that a memory controller chip area increases, a memory controller package area increases, a memory system substrate area increases, or the wiring of the substrate of the memory system becomes complicated. There is also a problem that the cost increases as a result.

1-2-1-1-2. Shared Wiring

Figure 10:
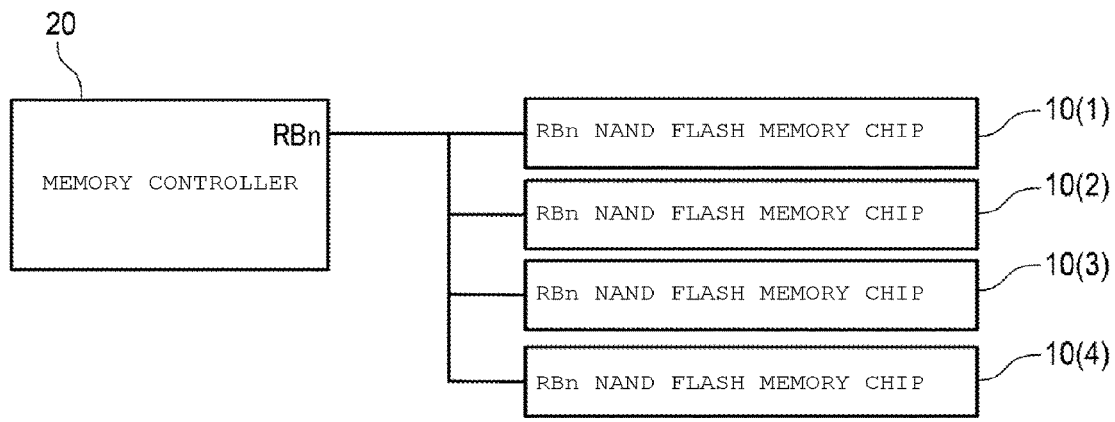
FIG. 10 is a diagram illustrating another connection relationship between a NAND flash memory chip and a memory controller.

As one of the wiring methods, as illustrated in FIG. 10, the shared wiring in which the wiring of one ready/busy signal and one ready/busy pin, to which one ready/busy signal wiring is connected, of the memory controller 20 are used for a plurality of (for example, four) NAND flash memory chips 10 may be considered. For example, when four NAND flash memory chips 10 are connected to the memory controller 20, one ready/busy signal RBn is prepared, and the wiring of one ready/busy signal and one ready/busy pin are used. Since the ready/busy signal is driven from each NAND flash memory chip 10 with open drain, if any one of the four NAND flash memory chips 10 is driven low (busy state), the ready/busy signal appears low (busy state) to the memory controller 20.

When four NAND flash memory chips 10 are connected to the memory controller 20 by the shared wiring, for example, when two out of four NAND flash memory chips 10 are in a busy state, the memory controller 20 cannot accurately specify which two NAND flash memory chips 10 are in a ready state. For that reason, it is necessary to specify the ready-state NAND flash memory chip 10 by individually issuing status read commands to be described later to the four NAND flash memory chips 10.

1-2-1-2. Problems that May Occur when Completion Detection Method 2 is Adopted

In the following, problems that may occur when the completion detection method 2 is adopted will be described.

Figure 11:
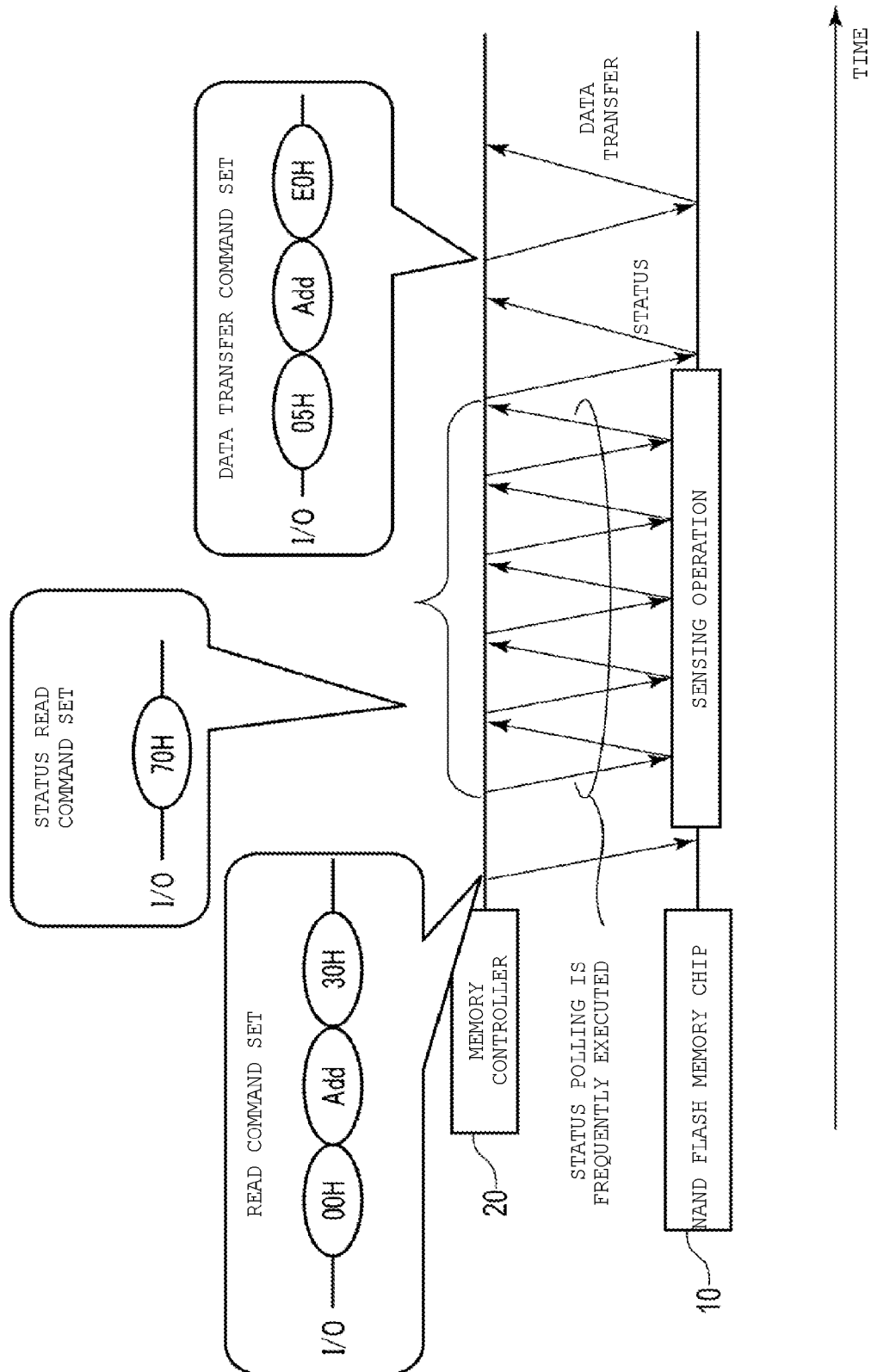
FIG. 11 is a diagram illustrating an example of a read operation when frequency of polling is high.

As illustrated in FIG. 11, the memory controller 20 may ascertain the status of the NAND flash memory chip 10 by issuing a status read command set including a status read command (70H) to the NAND flash memory chip 10. Such a set of commands related to status read is also described as a status read command set. Issuance of such a status read command set is also described as a status read request.

The memory controller 20 repeats the issuance of the status read command set until status information that the "sensing operation is completed" is obtained. Such repetition is also described as polling. As illustrated in FIG. 11, when frequency of polling is high, there is a problem that use efficiency of the input/output bus I/O is deteriorated and the power consumption is also increased.

Figure 12:
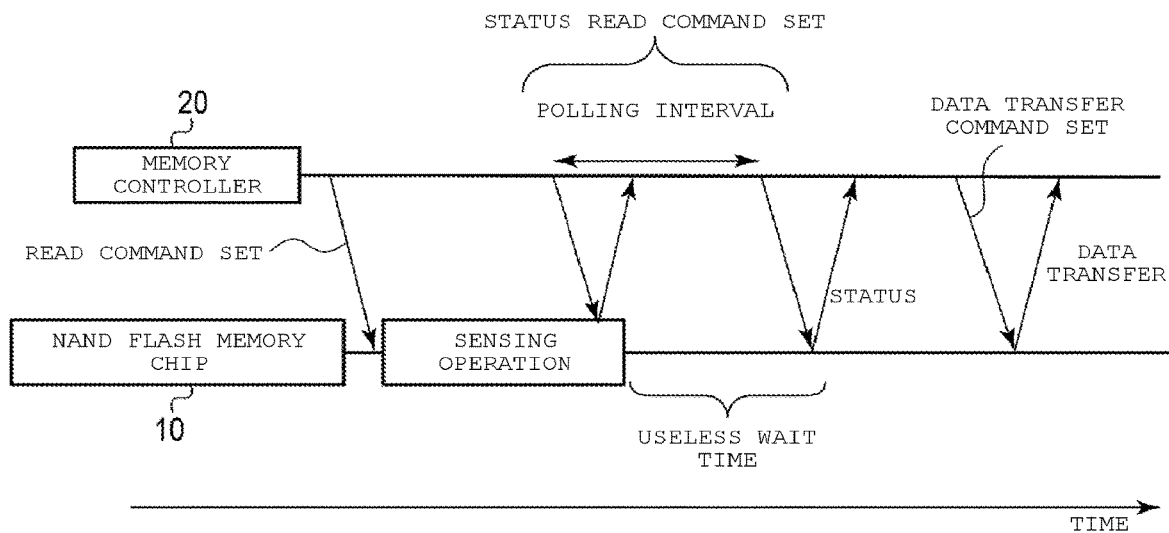
FIG. 12 is a diagram illustrating an example of the read operation when the frequency of polling is low.

On the other hand, as illustrated in FIG. 12, when the frequency of polling is low, the memory controller 20 delays detection of the state change of the NAND flash memory chip 10. As a result, even if the NAND flash memory chip 10 goes into a ready state after polling in which the result is a busy state, the memory controller 20 waits for next polling and then performs polling. For that reason, there is a problem that the memory controller 20 performs next polling to cause an unnecessary waiting time period until it is determined that the NAND flash memory chip 10 is in a ready state.

When variation in the sensing operation time period is large, optimization of polling frequency is not easy.

1-2-2. Basic Policy

A basic policy of this embodiment will be described below.

Figure 13:
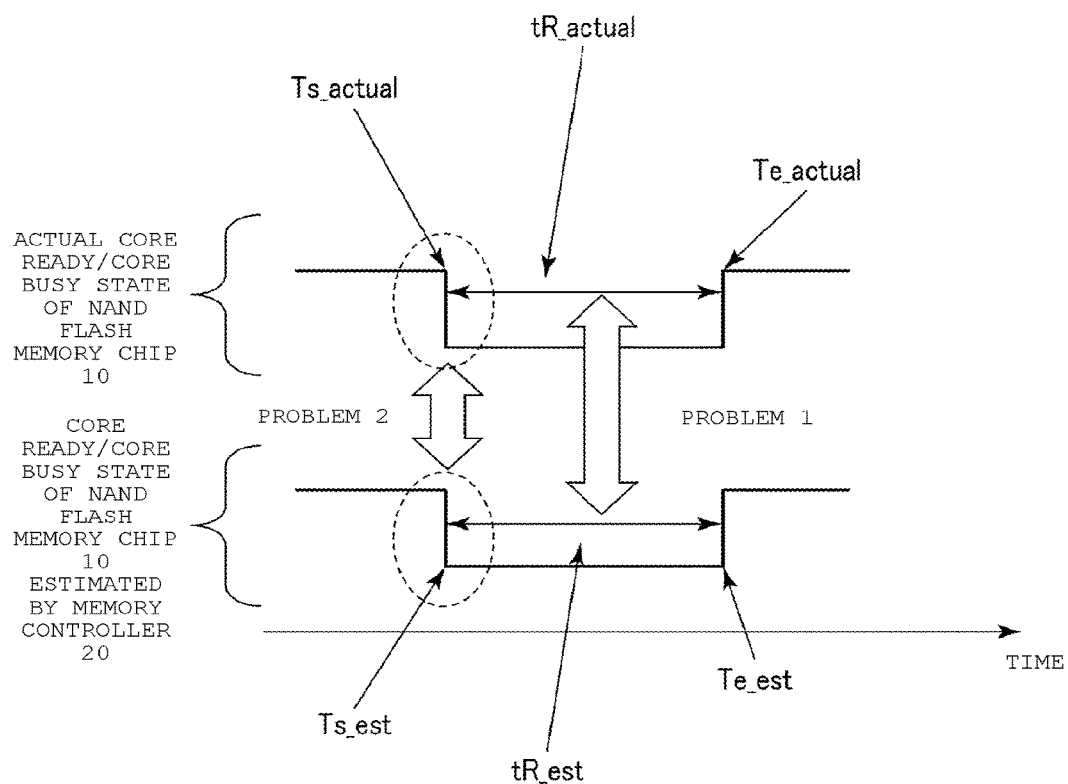
FIG. 13 is a diagram illustrating a relationship between an actual ready/busy state and a ready/busy state estimated by the memory controller during a sensing operation.

As described above, when it is attempted to detect the completion of the sensing operation, the problem described above arises. By the way, if it is possible to make actual completion time Te_actual of the sensing operation coincident with estimated completion time Te_est of the sensing operation, the problem described above is solved. As illustrated in FIG. 13, in order to estimate the completion of the sensing operation, there is a problem 1 of making the actual operation time period (busy time) tR_actual of the sensing operation coincident with the estimated operation time period tR_est of the sensing operation. In order to estimate the completion of the sensing operation, there is a problem 2 of making the time Ts_actual at which the sensing operation is actually started (the actual start time or actually achieved start time of sensing operation) coincident with the start time Ts_est of the estimated sensing operation. Accordingly, as illustrated in FIG. 13, the basic policy of this embodiment is to solve the problem 1 and the problem 2.

In the following, solution 1 of the problem 1 and solution 2 of the problem 2 will be described.

1-2-2-1. Solution 1 to Problem 1

It is conceivable that the solution 1 to the problem 1 is broadly divided into two types of solutions described later.

1-2-2-1-1. Solution 1(A)

In the solution 1(A) to the problem 1, the memory controller 20 ascertains the busy time period (the operation time period of the sensing operation) for each read condition in advance before performing the read operation and selects the waiting time period according to the read condition when issuing the read command set. The read condition means, for example, at least one of the type of read method, the type of storage method, and the page type (e.g., the kind of page such as upper page, middle page, lower page) in the word line. As a specific example of the type of read method, there is fast read/normal read/DLA read. As a specific example of the storage method, there is the SLC method/MLC method/TLC method/QLC method (Quadruple-Level Cell method: a method of storing 4-bit data per memory cell transistor MT). Further, the page type in the word line means lower page and upper page in the case of the MLC method, and there are lower page, middle page and upper page in the case of TLC method. As the read condition, a word line address, a word line group, or the address of the NAND flash memory chip 10 may be included. The word line group is a concept of treating a plurality of word lines as one group. For example, the word lines WL0 to WL3 are grouped with a word line group WGP1 and the word lines WL4 to WL7 are grouped with a word line group WGP2. The normal read operation time period is greater than the fast read operation time period. The DLA read broadly includes "pre-reading" and "main reading". The pre-reading is essentially an operation of reading data from the memory cell transistor MT connected to the word line WL adjacent on the drain side to the word line WL from which data is to be read. The main reading is an operation of reading data from the word line WL which is an original reading target. For that reason, the operation time period of the DLA read is longer than the operation time period of the normal read.

1-2-2-1-2. Solution 1(B)

In the solution 1(B) of the problem 1, when issuing the read command set, the memory controller 20 inquires of the NAND flash memory chip 10 about the busy time period scheduled by the NAND flash memory chip 10.

1-2-2-2. Solution to Problem 2

The solution 2 to a problem 2 may be broadly divided into two types as described later.

1-2-2-2-1. Solution 2(A)

In the solution 2(A) to the problem 2, the memory controller 20 regards the issue time of the read command set (or the time obtained by adding an offset to the issue time of the command set) as the start time of the sensing operation.

1-2-2-2-2. Solution 2(B)

In the solution 2(B) to the problem 2, when issuing the read command set, the memory controller 20 inquires of the NAND flash memory chip 10 about the actual start time Ts_actual of the sensing operation.

In order to estimate the completion of the sensing operation, it is necessary to solve both problem 1 and problem 2. That is, in order to estimate the completion of the sensing operation, one of the solution 1(A) or solution 1(B) is adopted, and one of the solution 2(A) or solution 2(B) is adopted.

The above solutions may be combined in various ways. In the first embodiment, a case where the solution 1(A) and solution 2(A) are adopted will be described. Other combinations will be described in other embodiments.

1-2-3. Read Operation of First Embodiment

In the following, a read operation of the first embodiment will be described below. As described above, in the first embodiment, the solution 1(A) and the solution 2(A) are adopted.

As the solution 1(A), a method of acquiring the sensing operation time period (or more generally "busy time period") tR_est from a tR table is adopted.

The tR table is a table in which the sensing operation time period tR_est is set based on the read condition. The tR table may be stored in a portion of the memory cell array 11 accessible by the memory controller 20 or a portion (ROM fuse) in which management information for the NAND flash memory chip 10 itself is stored. The tR table may be stored in the status register 15A or the embedded memory 23.

FIG. 14 illustrates an example of the tR table. FIG. 14 illustrates an example of the tR table when the storage method is the TLC method for the sake of simplicity.

As illustrated in FIG. 14, for example, the tR of the fast read is 10% shorter than the tR of the normal read, and the tR of the DLA read is three times the tR of the normal read. Specifically, in the TLC method, the tR for performing the fast read on the lower page is 36 µs. The tR for performing the normal read on the lower page is 40 µs. The tR for performing the DLA read on the lower page is 120 µs. Also, the tR for performing the fast read on the middle page is 63 µs. The tR for performing the normal read on the middle page is 70 µs. The tR for performing the DLA read on the middle page is 210 µs. Furthermore, the tR for performing the fast read on the upper page is 36 µs. The tR for performing the normal read on the upper page is 40 µs. The tR for performing the DLA read on the upper page is 120 µs.

The tR table is generated based on an evaluation result of the NAND flash memory chip 10. The tR table is generated when designing the NAND flash memory chip 10, manufacturing the NAND flash memory chip 10, designing the memory system 1, or manufacturing the memory system 1, and is stored in a non-volatile manner in a non-volatile memory such as the NAND flash memory chip 10 or the like in the memory system 1.

1-2-3-1. Operation Flow

A flow of the read operation according to the first embodiment will be described with reference to FIGS. 15 and 16.

[S100]

The memory controller 20 stores the tR table stored in the memory cell array 11 of the NAND flash memory chip 10 in the DRAM 30 at the startup of the memory system.

This step S100 may be performed when the memory system 1 is activated, and may be skipped as long as the tR table is stored in the DRAM 30.

[S101]

The memory controller 20 acquires the sensing operation time period tR_est from the tR table stored in the DRAM 30 based on the condition of the read command set issued to the NAND flash memory chip 10. The acquired sensing operation time period tR_est is temporarily stored in, for example, the RAM 23 or a storage unit (not illustrated) in the processor 21.

[S102]

The memory controller 20 issues the read command set to the NAND flash memory chip 10.

[S103]

When the memory controller 20 issues the read command set to the NAND flash memory chip 10, the memory controller 20 starts measuring the elapsed time period (from step S102) after issuing the read command set using the timer 22.

[S104]

The memory controller 20 determines whether or not the elapsed time period from step S102 is equal to or greater than the sensing operation time period tR_est acquired from the DRAM 30. When it is not determined that the elapsed time period from step S102 is equal to or greater than the sensing operation time period tR_est (NO in step S104), step S104 is repeated.

[S105]

On the other hand, when it is determined that the elapsed time period from step S102 is equal to or greater than the sensing operation time period tR_est (YES in step S104), the memory controller 20 issues the data transfer command set to the NAND flash memory chip 10. That is, the memory controller 20 issues the data transfer command set without checking the ready/busy state received from the ready/busy line and without performing the status read. That is, the memory controller 20 does not need the ready/busy signal line. As a modification example, even when it is determined that the elapsed time period from step S102 is equal to or greater than the sensing operation time period tR_est, the memory controller 20 may further perform the status read on the NAND flash memory chip 10 just in case. This way, the memory controller 20 can know definitively that the NAND flash memory chip 10 is in the ready state by performing the status read.

As described above, the memory controller 20 performs a data transfer request after the lapse of the sensing operation time period tR_est since the NAND flash memory chip 10 starts the sensing operation. For that reason, since the NAND flash memory chip 10 receives the data transfer request immediately after the sensing operation is ended, data read in the sensing operation may be transferred to the memory controller 20 without delay.

1-2-3-2. Operation Sequence

Figure 17:
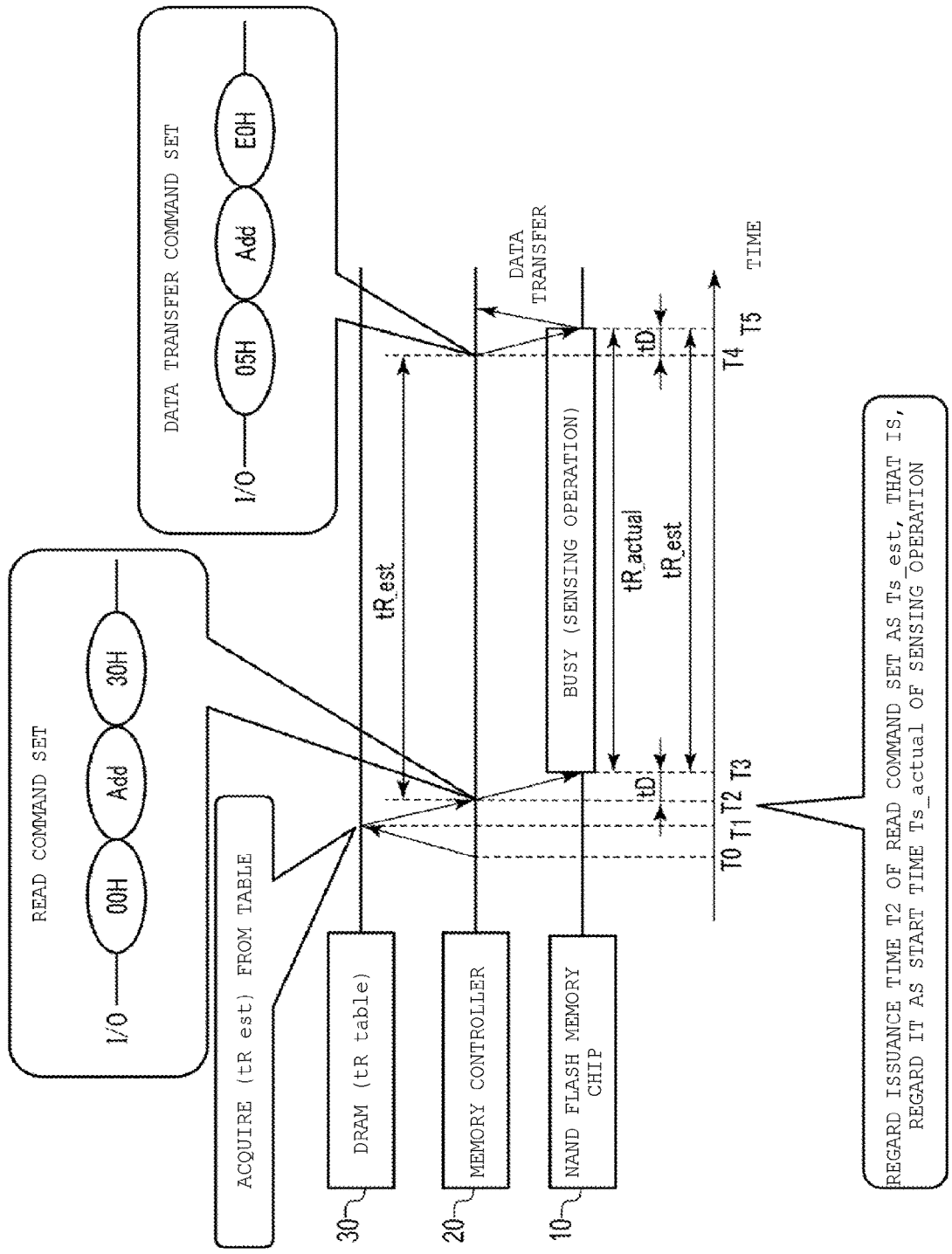
FIG. 17 is a timing diagram illustrating the read operation of the memory system according to the first embodiment.

A sequence example of the read operation of the first embodiment will be described with reference to FIG. 17. Here, for the sake of simplicity, a case where the tR table is already stored in the DRAM 30 will be described.

During the time period between time T0 and time T2, the memory controller 20 performs step S101. Specifically, during the time period between T0 and time T1, the memory controller 20 requests the DRAM 30 for the sensing operation time period tR_est. Between time T1 to time T2, the memory controller 20 acquires the sensing operation time period tR_est from the tR table of the DRAM 30 (Solution 1(A)).

At time T2, the memory controller 20 issues the read command set and starts measuring time (performs step S102 and step S103). The memory controller 20 regards the read command set issuance time T2 as Ts_est, that is, regards time T2 as the start time Ts_actual of the sensing operation (the solution 2(A)), and waits for the time period tR_est from time T2 when the read command set is issued.

When the read command set is received at the time T3 after the lapse of the time period tD from time T2, the NAND flash memory chip 10 starts the sensing operation and goes into a busy state. The time period tD is the time it takes the command set to be sent from the memory controller 20 to the NAND flash memory chip 10.

The memory controller 20 transmits the data transfer command set at time T4 (performs step S105) after the lapse of the time period tR_est from time T2.

The NAND flash memory chip 10 receives the data transfer command set and transfers data read from the memory cell by the sensing operation to the memory controller 20 at time T5 after the time period tR_est elapses from time T3 (after the lapse of the time period tD from time T4).

At the point in time when the memory controller 20 performs step S105, the sensing operation may not be ended in the NAND flash memory chip 10 in some cases. However, the NAND flash memory chip 10 receives the command set after the lapse of the time period tD since the memory controller 20 performed step S105, that is, after the sensing operation is completed. For that reason, the NAND flash memory chip 10 may transfer data to the memory controller 20 immediately after the end of the sensing operation. The time period between time T2 and time T3 may not be equal to the time period between time T4 and time T5. The memory controller 20 may wait for the time period tR_est from time T2 and may transmit the data transfer command set after waiting for an additional predetermined time period tD (step S105). With this configuration, even when the time period between time T2 and time T3 is longer than the time period between time T4 and time T5, the NAND flash memory chip 10 can properly receive the command set.

1-3. Effects

According to the embodiment described above, the memory controller 20 selects the standby time period from the tR table according to the read condition when issuing the read command set (the solution 1) and regards the issuance time of the read command set as the start time of the sensing operation (solution 2). With this configuration, the memory controller 20 can estimate the completion of the sensing operation.

As a result, problems that may occur when the completion detection methods 1 and 2 are adopted can be solved. For that reason, performance can be improved by preventing an increase in cost due to an increase in signal line wiring, occupation and high power consumption of the input/output bus I/O due to frequent polling, and reducing useless waiting. That is, it is possible to provide a memory system that exhibits high read performance.

2. Second Embodiment

A second embodiment will be described. In the second embodiment, a case where the solution 1(A) and solution 2(B) are adopted as a basic policy will be described. A basic configuration and basic operation of a device according to the second embodiment are the same as those of the device according to the first embodiment described above. Accordingly, the description of the matters described in the first embodiment described above and the matters that can be easily analogized from the first embodiment described above will be omitted.

2-1. Basic Policy

In the second embodiment, a case where the solution 1(A) and Solution 2(B) are adopted as a basic policy will be described.

2-1-1. Difficulty in Predicting Start Time of Sensing Operation

While the NAND flash memory chip 10 is performing a program operation which is a data write operation (The data write operation includes a program operation and a program verify operation of checking whether a memory cell of a programming target has reached a predetermined threshold voltage by the program. Also, a set of the program operation and the program verify operation may be described as a program loop), when the sensing operation is performed, it may be difficult to predict the start time of the sensing operation.

Here, an example in which the program is suspended and the sensing operation is performed will be described with reference to FIG. 18. In the following, the cache program will be described as an example. The cache program is a method of transferring pieces of new write data from the memory controller 20 to an unused cache (data latch 12B) while performing the program operation on the memory cell array 11. When the NAND flash memory chip 10 performs the program operation on a plurality of pages successively, the memory controller 20 simultaneously performs the program operation of a certain page (for example, the first page) and transfer of the write data for the next page of the first page, thereby capable of improving performance of the memory system 1. That is, the memory controller 20 can obtain such an effect by performing a cache program operation. The NAND flash memory chip 10 may suspend the cache program operation in the middle of the cache program operation, perform the read operation after the suspension, and restart the suspended program operation after the read operation is ended. As described above, when the cache program operation is suspended and the read operation is performed, read latency is improved as compared to a case where the read operation is performed after the completion of the cache program operation. However, the NAND flash memory chip 10 requires an available data latch during the read operation. For that reason, when the NAND flash memory chip 10 suspends the cache program operation and performs the read operation, it is necessary to wait until the program operation progresses far enough and a data latch becomes available (goes into a cache ready state among data latches). The condition for going into the cache ready state is that a data latch becomes available, for example, that a program has completed to a predetermined stage.

Figure 18:
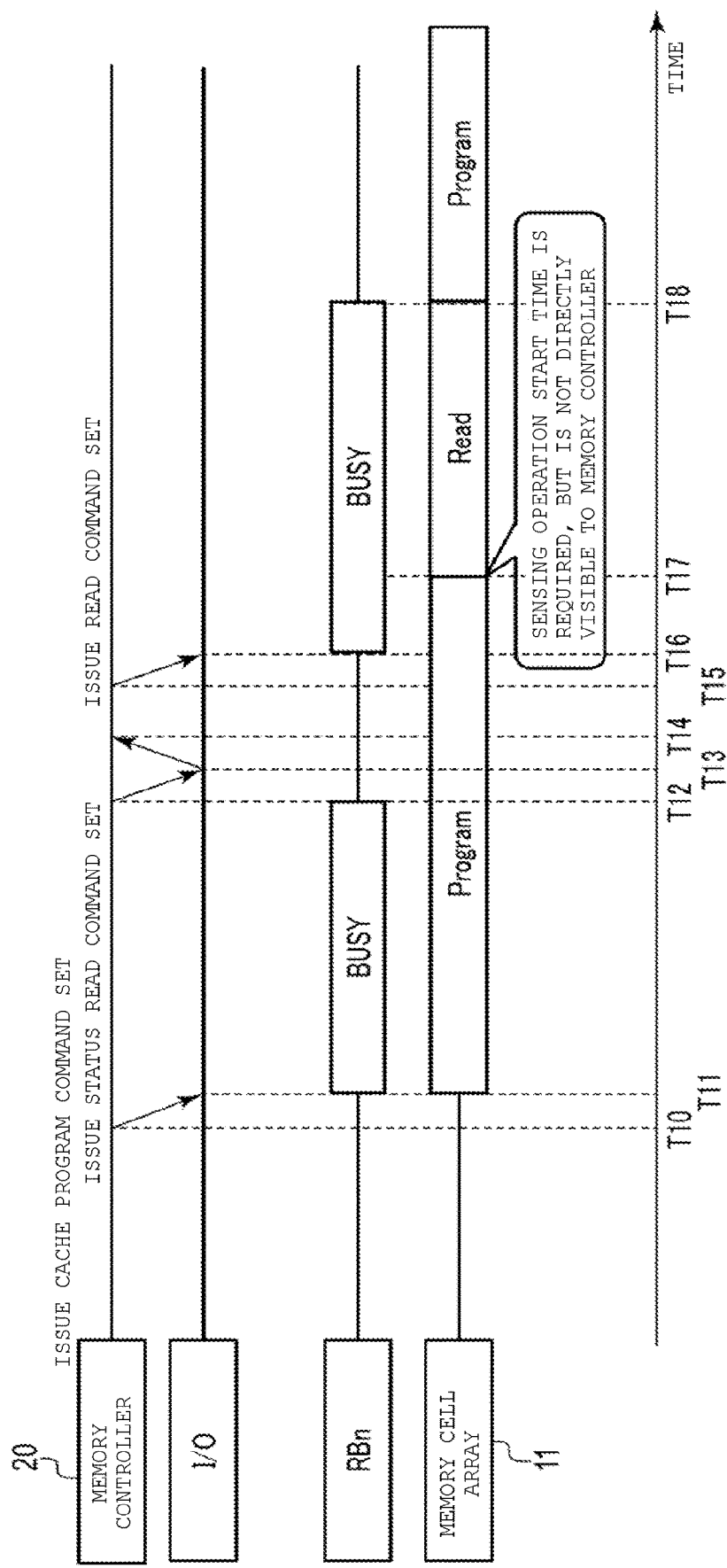
FIG. 18 is another timing diagram illustrating an example of the read operation.

In FIG. 18, since the ready/busy signal RBn is, for example, not wired or shared by the plurality of NAND flash memory chips 10, the ready/busy signal RBn is not directly visible to the memory controller 20.

At time T10, the memory controller 20 issues a cache program command set to the input/output bus I/O of the NAND flash memory chip 10. The cache program command set means a set of commands related to the cache program.

At time T11, when the NAND flash memory chip 10 receives the cache program command set, the cache program operation to the memory cell array 11 is started. Then, the NAND flash memory chip 10 transitions the ready/busy signal RBn from the ready state to the busy state.

In the case of the cache program operation, at the timing when the data latch 12B becomes available, the NAND flash memory chip goes into the cache ready state and a command is received. For that reason, at time T12, the NAND flash memory chip 10 transitions the ready/busy signal RBn from the busy state to the ready state during the cache program operation. This indicates that a read command or a data transfer command for the next program may be received. In the case of the cache program operation, the NAND flash memory chip 10 may receive data by the data latch 12B, that is, the NAND flash memory chip 10 goes into the cache ready state at the timing when a storage area of the data latch is available.

At time T12, the memory controller 20 issues the status read command set to the input/output bus I/O of the NAND flash memory chip 10. With this configuration, during the time period between time T13 and time T14, the memory controller 20 can recognize that the NAND flash memory chip 10 is in the cache ready state. In this example, the NAND flash memory chip 10 is in the cache ready state at the point in time when the status read command set is issued by chance. However, the NAND flash memory chip 10 may not be in the cache ready state at the point in time when the status read command set is issued. In this latter case, the memory controller 20 repeats issuance of the status read command set until the memory controller 20 recognizes that the NAND flash memory chip 10 is in the cache ready state.

At time T15, the memory controller 20 issues the read command set to the input/output bus I/O of the NAND flash memory chip 10 which is performing the cache program, to the memory cell array 11.

The ready/busy signal RBn shifts from the busy state to the ready state at time T12, and is actually in the core busy state in which the program operation to the memory cell array 11 is continued. The NAND flash memory chip 10 does not necessarily perform the read operation immediately after receiving the read command set. For that reason, the memory controller 20 cannot regard issuance time of the read command set as sensing operation start time.

At time T16, when the NAND flash memory chip 10 receives the read command set, the NAND flash memory chip 10 determines to suspend the cache program being executed. When the cache program is suspended, the cache program is suspended (time T17) after the cache program is performed to an appropriate stage (for example, until the set of program operation and program verify operation (program loop) has ended).

At time T16, when the read command set is received, the ready/busy signal RBn goes into the busy state. However, the sensing operation is not immediately started at time T16.

For that reason, since the issue timing of the read command set cannot be regarded as the start time of the sensing operation, when the solution 2(A) is adopted, the memory controller 20 may not correctly estimate T18 which is the end time Te_actual of the sensing operation.

Accordingly, it is conceivable to adopt the solution 2(B) instead of the solution 2(A). In the solution 2(B), the memory controller 20 inquires of the NAND flash memory chip 10 about the actual start time Ts_actual of the sensing operation after issuance of the read command set.

2-1-2. Variation of Solution 2(B)

Here, the solution 2(B) will be described in more detail

In general, there two methods for the memory controller 20 to inquire about the actual start time Ts_actual of the sensing operation.

2-1-2-1. Solution 2(B-1)

As a first variation (solution 2(B-1)) of the solution 2(B), the memory controller 20 inquires the NAND flash memory chip 10 about the scheduled suspend time of the operation before issuance of the read command set. The scheduled suspend time means a scheduled time of an operation before issuance of a read command set, that is, suspension or completion of a program operation or an erase operation, or completion of a sensing operation during a cache read operation. Then, the memory controller 20 waits until (or after) the scheduled suspend time, and inquires of the NAND flash memory chip 10 about the actual start time Ts_actual of the sensing operation.

2-1-2-2. Solution 2(B-2)

In the second variation (solution 2(B-2)) of the solution 2(B), the memory controller 20 repeats the inquiry of the actual start time Ts_actual of the sensing operation to the NAND flash memory chip 10 until the actual start time of the sensing operation is obtained.

In the second embodiment, a case where the solution 1(A) and solution 2(B-1) are adopted will be described.

2-2 Read Operation of Second Embodiment

In the following, a read operation of a second embodiment will be described.

2-2-1. Operation Flow

The read operation after the cache program will be described with reference to FIG. 19.

[S200]

The memory controller 20 issues the cache program command set to the NAND flash memory chip 10. With this configuration, the NAND flash memory chip 10 executes the cache program.

[S201]

The memory controller 20 issues the status read command set to the NAND flash memory chip 10. When the status read command set is received, the NAND flash memory chip 10 transmits a status (cache ready/cache busy state) to the memory controller 20.

[S202]

The memory controller 20 determines whether the NAND flash memory chip 10 is in the cache ready state. When it is determined that the NAND flash memory chip 10 is not in the cache ready state (NO in S202), the memory controller 20 repeats step S201.

[S203]

When it is determined that the NAND flash memory chip 10 is in the cache ready state (YES in S202), the memory controller 20 issues the read command set to the NAND flash memory chip 10. When the read command set is received, the NAND flash memory chip 10 determines to suspend the cache program and execute the sensing operation. When the NAND flash memory chip 10 determines to suspend the cache program and execute the sensing operation, the NAND flash memory chip 10 performs the program to an appropriate location and then suspends the program. After that, the sensing operation is started. For that reason, the NAND flash memory chip 10 does not necessarily start the sensing operation immediately after receiving the read command set. When the NAND flash memory chip 10 receives the read command set while performing the cache program, the NAND flash memory chip 10 derives the time to reach the appropriate stage in the cache program, that is, the scheduled suspend time of the cache program, and stores it in the status register 15A. When the read command set is received during performing the cache program, the NAND flash memory chip 10 cannot always predict the scheduled suspend time of the cache program. The timing of entering the cache ready state may change dynamically because it may depend on the write state of the memory cell. For that reason, it is conceivable that the NAND flash memory chip 10 notifies the memory controller 20 of the rough reference time and the memory controller 20 checks the ready/busy state of the NAND flash memory chip 10 using the status read command when the reference time comes. On the other hand, in some embodiments, the NAND flash memory chip 10 responds to the memory controller 20 that "it is not determined" until the scheduled suspend time can be reliably predicted, and the memory controller 20 repeats the inquiry until the scheduled suspend time is obtained.

[S204]

The memory controller 20 inquires of the NAND flash memory chip 10 about a scheduled suspend time Tp of the cache program that is instructed to start execution in step S200. The scheduled suspend time Tp of the cache program is stored, for example, in the status register 15A. The NAND flash memory chip 10 supplies the scheduled suspend time Tp of the cache program stored in the status register 15A to the memory controller 20.

[S205]

The memory controller 20 acquires the sensing operation time period tR_est from the tR table stored in the DRAM 30 based on the condition of the read command set issued to the NAND flash memory chip 10.

Figure 15:
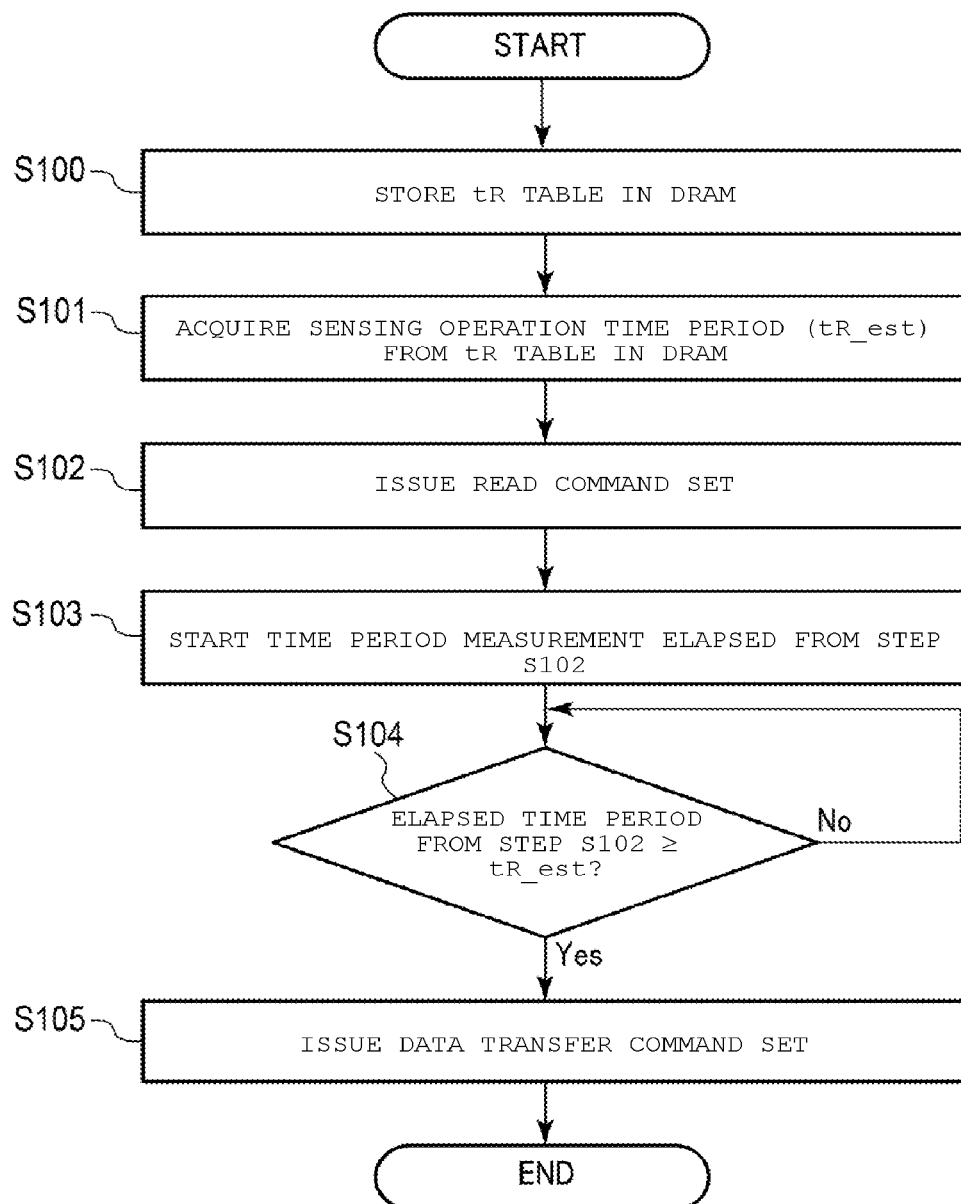
FIG. 15 is a flowchart illustrating the read operation of the memory system according to the first embodiment.
Figure 16:
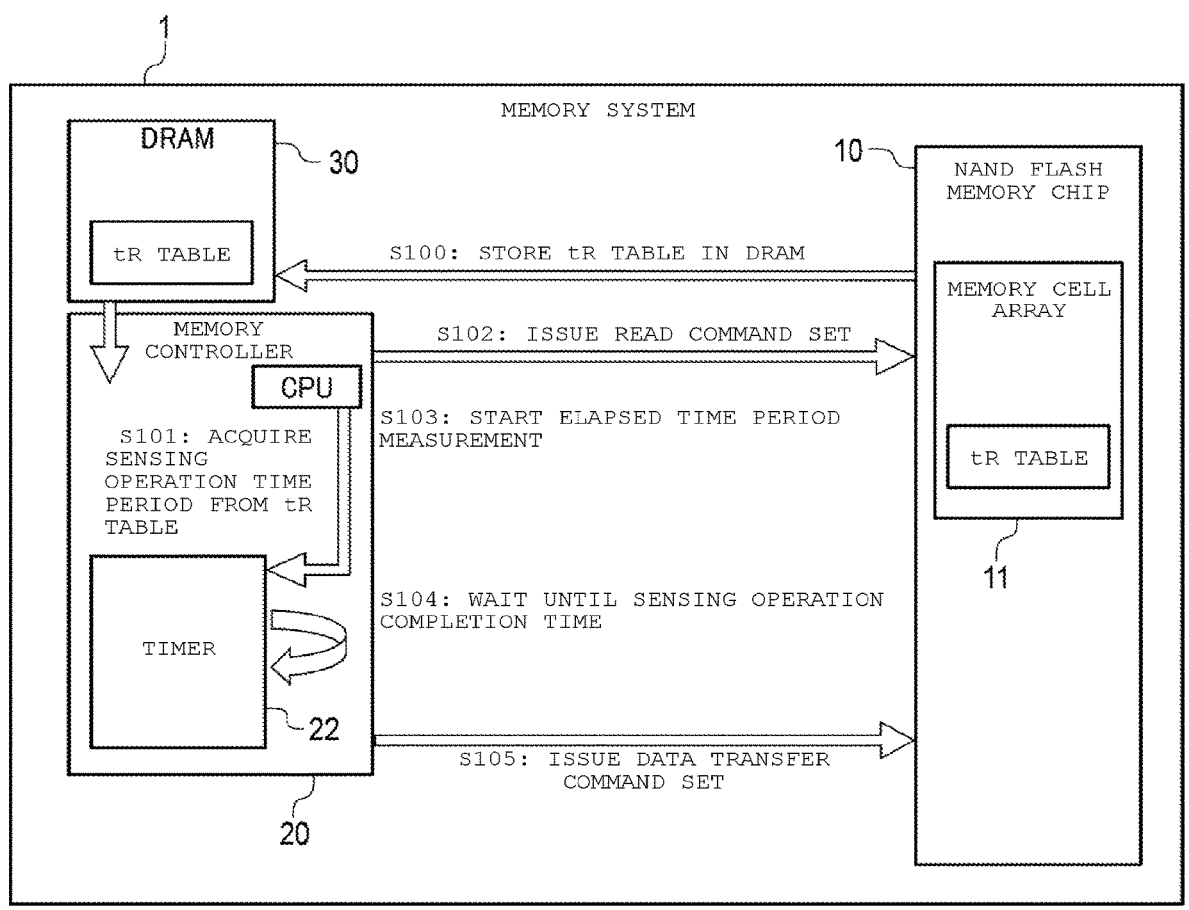
FIG. 16 is a conceptual diagram illustrating the read operation of the memory system according to the first embodiment.

Here, for the sake of simplicity, the description of the operation of storing the tR table in the DRAM 30 corresponding to step S100 in FIG. 15 is omitted.

The operation corresponding to step S100 may be performed before step S205. Step S205 may be performed before step S203.

[S206]

The memory controller 20 determines whether or not the current time is after the scheduled suspend time Tp acquired from the NAND flash memory chip 10. When it is determined that the current time is not after the scheduled suspend time Tp acquired from the NAND flash memory chip 10 (NO in step S206), the memory controller 20 repeats step S206.

[S207]

When it is determined that the current time is after the scheduled suspend time Tp acquired from the NAND flash memory chip 10 (YES in step S206), the memory controller 20 inquires of the NAND flash memory chip 10 about the actual start time T_read_start of the sensing operation of the read command issued in step S203. The actual start time T_read_start of the sensing operation is stored, for example, in the status register 15A after the start of the sensing operation. When a start time inquiry (as an example, a status read request) of the sensing operation is received, the NAND flash memory chip 10 supplies, to the memory controller 20, the actual start time T_read_start of the sensing operation of the read command issued in step S203 and stored in the status register 15A.

[S208]

When the actual start time T_read_start of the sensing operation is acquired, the memory controller 20 calculates a difference between the current time and the actual start time T_read_start of the sensing operation. Then, the memory controller 20 determines whether or not the difference between the current time and the actual start time T_read_start of the sensing operation, that is, the elapsed time period from the actual start time T_read_start of the sensing operation is equal to or greater than the sensing operation time period tR_est. When it is determined that the elapsed time period from the actual start time T_read_start of the sensing operation is not equal to or greater than the sensing operation time period tR_est (NO in step S208), the memory controller 20 repeats the step S208.

[S209]

When it is determined that the elapsed time period from the actual start time T_read_start of the sensing operation is equal to or greater than the sensing operation time period tR_est (YES in step S208), the memory controller 20 issues the data transfer command set to the NAND flash memory chip 10. As a modification example, even when it is determined that the elapsed time period from the actual start time T_read_start of the sensing operation is equal to or greater than the sensing operation time period tR_est, the memory controller 20 may further perform the status read on the NAND flash memory chip 10 just in case. By performing the status read, the memory controller 20 can know definitively that the NAND flash memory chip 10 is in the ready state and can cause the NAND flash memory chip 10 to receive the data transfer command set.

The NAND flash memory chip 10 can transfer the data read in the sensing operation to the memory controller 20 without delay.

2-2-2. Operation Sequence

An example of a sequence of the read operation of the second embodiment will be described with reference to FIG. 20.

Here, as an example, a case where the cache program is suspended and the sensing operation is performed will be described.

Figure 20:
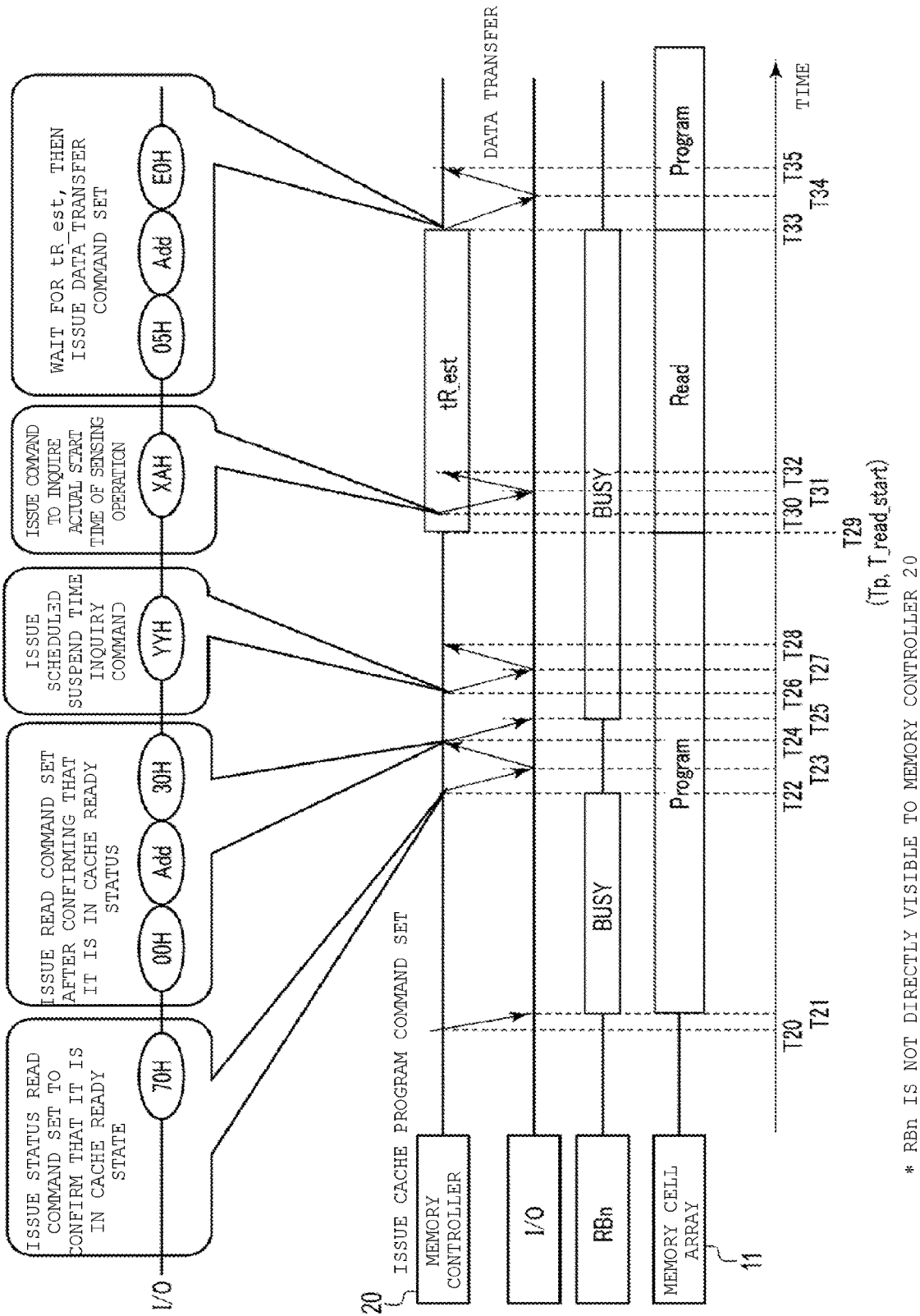
FIG. 20 is a timing diagram illustrating the read operation of the memory system according to the second embodiment.

In FIG. 20, since the ready/busy signal RBn is, for example, not wired or shared by the plurality of NAND flash memory chips 10, the ready/busy signal RBn is not directly visible to the memory controller 20.

At time T20, the memory controller 20 issues a cache program command set to the input/output bus I/O of the NAND flash memory chip 10.

At time T21, when the NAND flash memory chip 10 receives the cache program command set, the cache program operation to the memory cell array 11 is started. Then, the ready/busy signal RBn goes into the busy state.

At time T22, when the ready/busy signal RBn goes into the cache ready state after a predetermined time period after the start of the cache program operation, for example, when the available data latch can be occurred due to the progress of the program operation, the ready/busy signal RBn goes into the cache ready state.

At time T22, the memory controller 20 issues the status read command set (70H) to the input/output bus I/O of the NAND flash memory chip 10. With this configuration, during the time period between time T23 and time T24, the memory controller 20 can recognize that the NAND flash memory chip 10 is in the cache ready state. In this example, the NAND flash memory chip 10 is in the cache ready state at the point in time when the status read command set is issued by chance, but the NAND flash memory chip 10 may not be in the cache ready state at the point in time when the status read command set is issued. In this case, the memory controller 20 repeats issuance of the status read command set until the memory controller 20 recognizes that the NAND flash memory chip 10 is in the cache ready state.

At time T24, the memory controller 20 issues the read command set to the input/output bus I/O of the NAND flash memory chip 10 which is performing the cache program to the memory cell array 11.

At time T25, when the NAND flash memory chip 10 receives the read command set, the NAND flash memory chip 10 determines to suspend the cache program being executed. When suspending the cache program, the NAND flash memory chip 10 cannot suspend the program immediately after receiving the read command set, but suspends the program after the program is performed to an appropriate location. When the NAND flash memory chip 10 receives the read command set while performing the cache program, the NAND flash memory chip 10 derives the time to reach the appropriate stage in the cache program, that is, the scheduled suspend time of the cache program, and stores it in the status register 15A. However, since the scheduled suspend time Tp depends on a verify result, the NAND flash memory chip 10 cannot always determine the scheduled suspend time Tp immediately. At time T25, the ready/busy signal RBn is in the busy state at the point in time when the read command is received, but at this point in time, the sensing operation is not started but is started at time T29.

At time T26, the memory controller 20 issues a scheduled suspend time inquiry command (as one example, a status read command set) to inquire about the scheduled suspend time Tp of the cache program being executed.

At time T27, the NAND flash memory chip 10 supplies the scheduled suspend time Tp of the cache program stored in the status register 15A and is instructed to start execution in step S200 to the memory controller 20.

At time T28, when the scheduled suspend time Tp of the cache program is received, the memory controller 20 waits until the scheduled suspend time Tp (in this example, time T29).

At time T29, which is a scheduled suspend time Tp of the cache program, the NAND flash memory chip 10 starts the sensing operation, and stores the actual start time T_read_start of the sensing operation in the status register 15A. In this example, since the NAND flash memory chip 10 suspends the cache program at time T29, which is the scheduled suspend time Tp, and starts the sensing operation at time T29, the scheduled suspend time Tp and the actual start time T_read_start of the sensing operation match coincide with each other, and both are at time T29. In this example, the scheduled suspend time Tp and the actual start time T_read_start of the sensing operation coincide. In some cases, they may not coincide.

At time T30, which is as early as possible after time T29, the memory controller 20 issues, to the NAND flash memory chip 10, an actual start time inquiry command (as an example, status read command set (XAH)), which inquires about the actual start time T_read_start of the sensing operation being executed, of the sensing operation.

At time T31, the NAND flash memory chip 10 supplies the actual start time T_read_start of the sensing operation under execution stored in the status register 15A to the memory controller 20.

At time T32, when the actual start time T_read_start of the sensing operation is received from the NAND flash memory chip 10, the memory controller 20 waits from the actual start time T_read_start (time T29) for the time period tR_est, that is, until time T33. The time period tR_est is acquired from the tR table.

The memory controller 20 issues the data transfer command set to the NAND flash memory chip 10 at time T33 after the lapse of the time period tR_est from the actual start time T_read_start.

With this configuration, at time T34, the NAND flash memory chip 10 transfers data to the memory controller 20.

2-3. Effects

According to the embodiment described above, the memory controller 20 inquires about the scheduled suspend time of one previous command when issuing the read command set and inquires about the actual start time of the sensing operation after the scheduled suspend time of the one previous command (solution 2(B-1)). The memory controller 20 selects a wait time period according to the read condition when issuing the read command set (solution 1). With this configuration, the memory controller 20 can estimate the completion of the sensing operation without using the ready/busy signal.

As described above, when the sensing operation is performed during the operation of the cache program or the like, it may be difficult to predict the start time of the sensing operation. According to the embodiment described above, even in such a case, the memory controller 20 may be able to estimate the completion of the sensing operation.

3. Third Embodiment

A third embodiment will be described. In the third embodiment, a case where the solution 1(A) and solution 2(B-2) are adopted as a basic policy will be described. A basic configuration and a basic operation of the device according to the third embodiment are the same as those of the devices according to the first and second embodiments described above. Accordingly, the description of the matters described in the first and second embodiments and the matters that can be easily analogized from the first and second embodiments will be omitted.

3-1. Basic Policy

In the third embodiment, the solution 1(A) and solution 2(B-2) are adopted as the basic policy.

3-2. Read Operation of Third Embodiment

A read operation of the third embodiment will be described below.

3-2-1. Operation Flow

The read operation after the cache program will be described with reference to FIG. 21.

[S300] to [S304]

Figure 19:
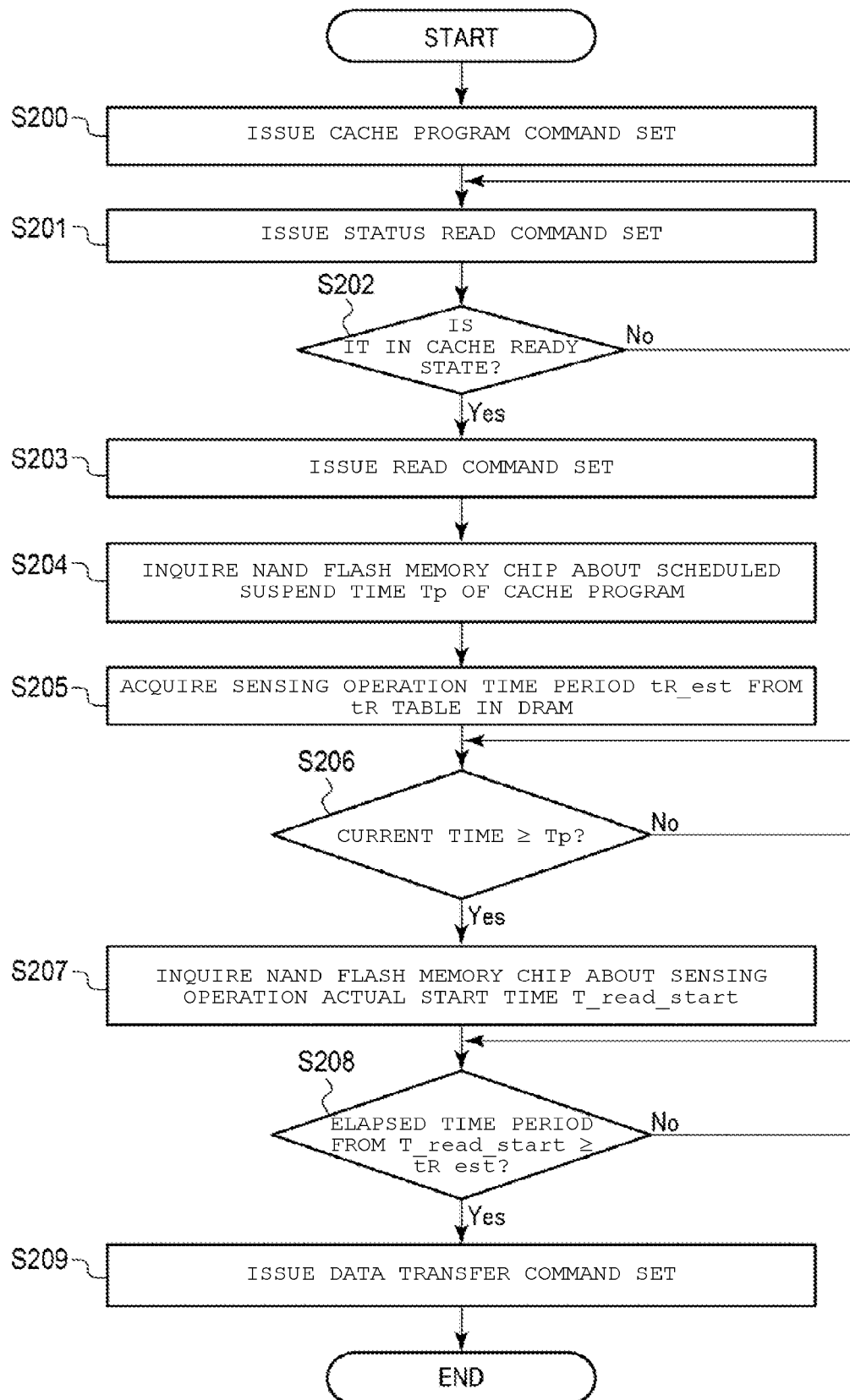
FIG. 19 is a flowchart illustrating a read operation of a memory system according to a second embodiment.

Steps S300 to S304 perform the same operations as steps S200 to S203 and S205 in FIG. 19, respectively.

[S305]

The memory controller 20 issues an inquiry command (as an example, a status read command set) of the actual start time T_read_start of the sensing operation to the NAND flash memory chip 10.

When the sensing operation is started, the NAND flash memory chip 10 stores the actual start time T_read_start of the sensing operation in the status register 15A. Then, in response to an inquiry from the memory controller 20, the NAND flash memory chip 10 supplies the actual start time T_read_start of the sensing operation stored in the status register 15A to the memory controller 20.

When the NAND flash memory chip 10 starts the sensing operation at the point in time when the inquiry is received, the NAND flash memory chip 10 returns the actual start time. When the NAND flash memory chip 10 does not start the sensing operation at the point in time when the inquiry is received, the NAND flash memory chip 10 returns the fact that the sensing operation is not started.

[S306]

The memory controller 20 determines whether or not the actual start time T_read_start of the sensing operation can be acquired from the NAND flash memory chip 10.

When the NAND flash memory chip 10 starts the sensing operation at the point in time when the inquiry is received, the NAND flash memory chip 10 returns the actual start time and thus the memory controller 20 determines that the start operation time T_read_start of the sensing operation is acquired (YES in step S306). On the other hand, when the NAND flash memory chip 10 does not start the sensing operation at the point in time when the inquiry is received, the NAND flash memory chip 10 returns the fact that the sensing operation is not started and thus the memory controller 20 determines that the actual start time T_read_start of the sensing operation is not acquired (NO in step S306), and repeats step S305.

[S307]

When the actual start time T_read_start of the sensing operation is acquired (YES in step S306), the memory controller 20 calculates the difference between the current time and the actual start time T_read_start of the sensing operation. That is, the memory controller 20 determines whether or not the difference between the current time and the actual start time T_read_start of the sensing operation, that is, the elapsed time period from the actual start time T_read_start of the sensing operation, is equal to or greater than the sensing operation time period tR_est. When it is determined that the elapsed time period from the actual start time T_read_start of the sensing operation is not equal to or greater than the sensing operation time period tR_est (NO in step S307), the memory controller 20 repeats step S307.

[S308]

When it is determined that the elapsed time period from the actual start time T_read_start of the sensing operation is equal to or greater than the sensing operation time period tR_est (YES in step S307), the memory controller 20 issues the data transfer command set to the NAND flash memory chip 10. As a modification example, even when it is determined the elapsed time period from actual start time T_read_start of the sensing operation is equal to or greater than sensing operation time period tR_est, the memory controller 20 may further perform the status read on the NAND flash memory chip 10 just in case. By performing the status read, the memory controller 20 can know definitively that the NAND flash memory chip 10 is in the ready state and can cause the NAND flash memory chip 10 to receive the data transfer command.

The NAND flash memory chip 10 can transfer the data read in the sensing operation to the memory controller 20 without delay.

3-2-2. Operation Sequence

An example of a sequence of a read operation of the third embodiment will be described with reference to FIG. 22.

Here, as an example, a case where the cache program is suspended and the sensing operation is performed will be described.

Figure 22:
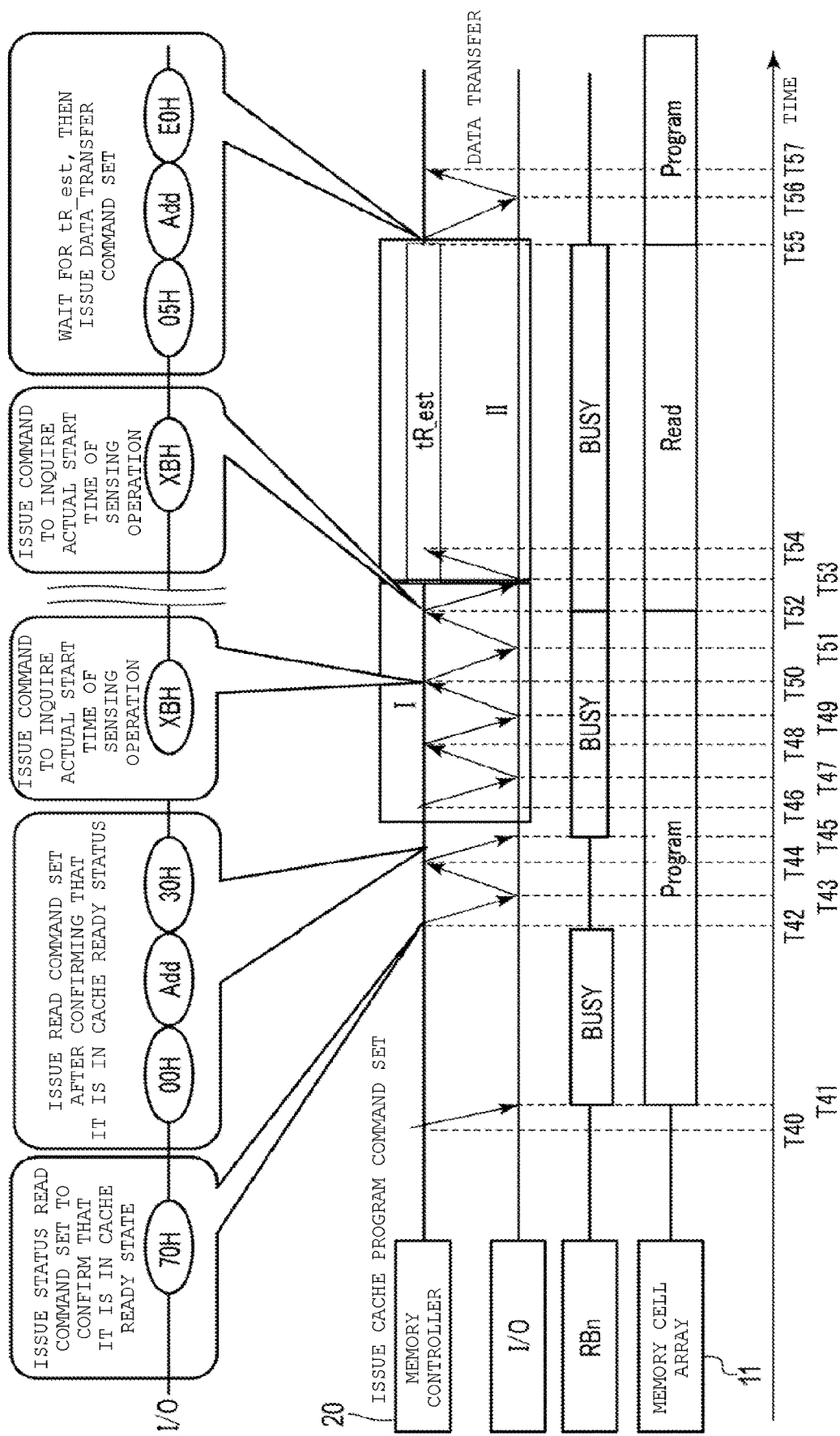
FIG. 22 is a timing diagram illustrating the read operation of the memory system according to the third embodiment.

In FIG. 22, since the ready/busy signal RBn is, for example, not wired or shared by the plurality of NAND flash memory chips 10, the ready/busy signal RBn is not directly visible to the memory controller 20.

The operations at time T40 to T45 are the same as the operations at time T20 to T25 in FIG. 20, respectively, and thus the description thereof is omitted.

At time T46, the memory controller 20 issues a command to inquire the actual start time of the sensing operation (for example, a status read request (XBH)) to the input/output bus I/O of the NAND flash memory chip 10. When the NAND flash memory chip 10 starts the sensing operation at the point in time when the inquiry is received, the NAND flash memory chip 10 returns the actual start time. When the NAND flash memory chip 10 does not start the sensing operation at the point in time when the inquiry is received, the NAND flash memory chip 10 returns the fact that the sensing operation is not started. During the time period between time T47 and time T48, the memory controller 20 receives, as a reply, the actual start time or the fact that the sensing operation is not started from the NAND flash memory chip 10. As illustrated at time T46 to T54, the memory controller 20 repeats the issuance of the command to inquire the actual start time of the sensing operation until the start of the sensing operation is checked.

At time T52, the NAND flash memory chip 10 starts the sensing operation. Since the actual start time inquiry command of the sensing operation is received at time T53 after the start of the sensing operation, the NAND flash memory chip 10 supplies the actual start time T_read_start of the sensing operation under execution stored in the status register 15A to the memory controller 20.

At time T54, upon receiving the actual start time T_read_start of the sensing operation, the memory controller 20 waits for the time period tR_est from the actual start time T_read_start.

The memory controller 20 issues the data transfer command set to the NAND flash memory chip 10 at time T55 after the lapse of the time period tR_est from the actual start time T_read_start.

Thus, at time T55 to T56, the NAND flash memory chip 10 transfers data to the memory controller 20.

3-3. Effects

According to the embodiment described above, after issuing the read command set, the memory controller 20 repeatedly inquires about the actual start time of the sensing operation. With this configuration, the same effect as that of the second embodiment can be obtained.

4. Fourth Embodiment

A fourth embodiment will be described. In the fourth embodiment, a case where the solution 1(B) and solution 2(A) are adopted as a basic policy will be described. A basic configuration and basic operation of the device according to the fourth embodiment are the same as those of the device according to the first embodiment described above except that the memory controller does not need to be equipped with the tR table. Accordingly, the description of the matters described in the first embodiment described above and the matters that can be easily analogized from the first embodiment described above will be omitted.

4-1. Basic Policy

In the fourth embodiment, a case where the solution 1(B) and solution 2(A) are adopted as the basic policy will be described.

4-1-1. Variations of Solution 1(B)

Hereinafter, variations of the solution 1(B) will be described in detail.

In general, there are two methods for the memory controller 20 to inquire about the sensing operation time period.

Solution 1(B-1)

As a first variation (solution 1(B-1)) of the solution 1(B), the memory controller 20 designates a read condition and inquires of the NAND flash memory chip 10 about the time period required for the sensing operation (sensing operation time period) before the issuance of the read command set. The NAND flash memory chip 10 estimates a sensing operation time period based on the read condition and returns the sensing operation time period to the memory controller 20. With this configuration, the memory controller 20 can obtain the sensing operation time period.

Solution 1(B-2)

As a second variation (solution 1(B-2)) of the solution 1(B), the memory controller 20 inquires of the NAND flash memory chip 10 about the sensing operation time period after the issuance of the read command set. The NAND flash memory chip 10 estimates the sensing operation time period based on the read condition in the read command received immediately before and returns the sensing operation time period to the memory controller 20. With this configuration, the memory controller 20 can obtain the sensing operation time period.

In the fourth embodiment, a case where the solution 1(B-1) and solution 2(A) are adopted will be described.

4-2. Read Operation of Fourth Embodiment

In the following, a read operation of the fourth embodiment will be described below.

4-2-1. Operation Flow

A flow of the read operation according to the fourth embodiment will be described with reference to FIG. 23.

[S400]

The memory controller 20 specifies a read command scheduled to be issued next. For example, the NAND interface circuit 26 is provided with a queue (not illustrated) in which command sets are stored in a first in first out (FIFO) scheme. Then, the processor 21 specifies a read command to be issued first, which is stored in the queue.

[S401]

After specifying the read command to be issued first, the memory controller 20 specifies the read condition based on the contents of a command set (command and address) of the specified read command. Then, the memory controller 20 issues a sensing operation time period inquiry command based on the specified read condition to the NAND flash memory chip 10.

When the sensing operation time period inquiry command set for inquiring the sensing operation time period is received from the memory controller 20, the NAND flash memory chip 10 reads the sensing operation time period tR_est from a tR prediction unit (A portion where tR is calculated or stored based on the read condition. For example, a table) based on the read condition in the command set. Then, the NAND flash memory chip 10 supplies the sensing operation time period tR_est to the memory controller 20. With this configuration, the memory controller 20 acquires the sensing operation time period tR_est.

Figure 24:
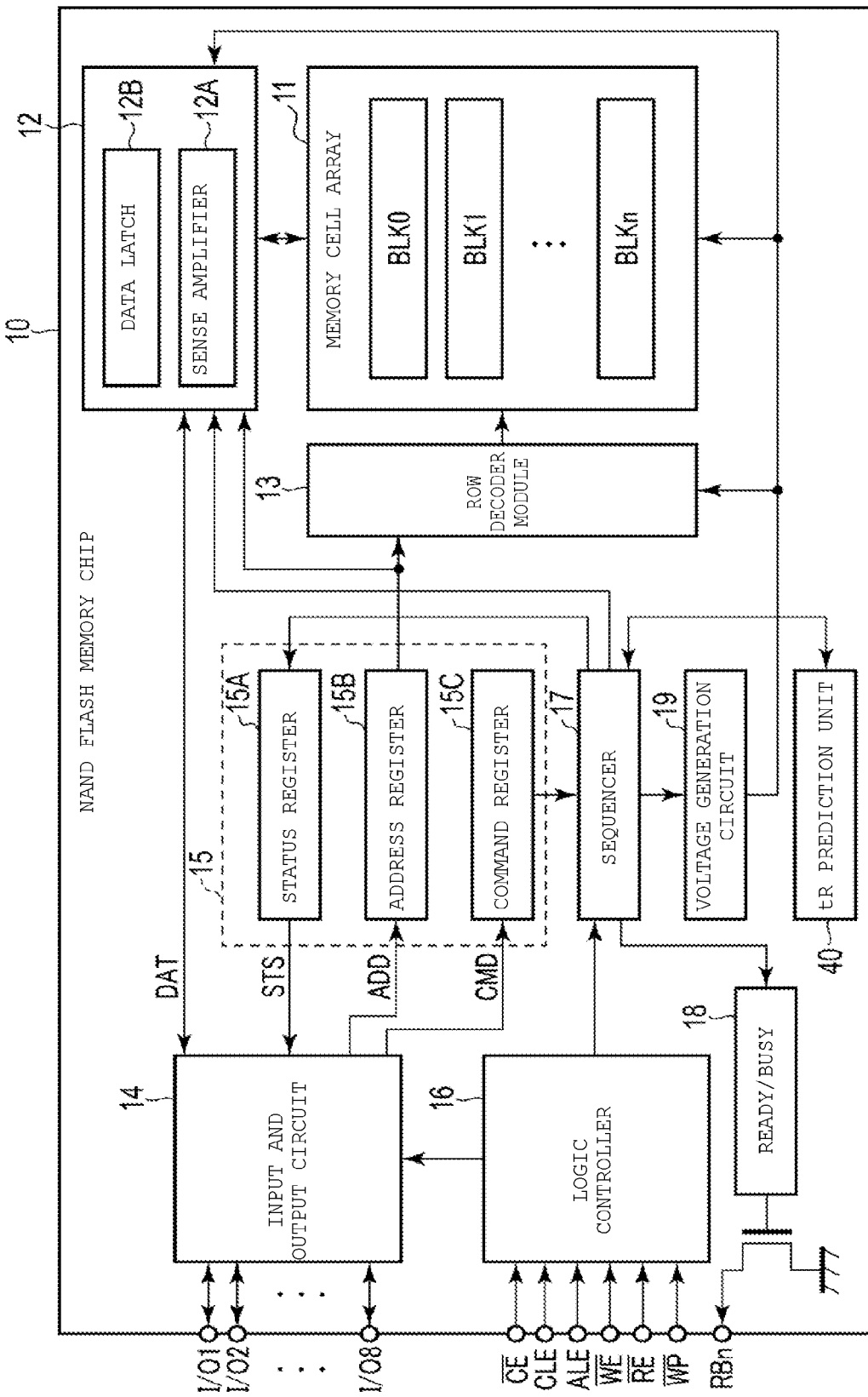
FIG. 24 is a block diagram illustrating a configuration example of a NAND flash memory chip in the fourth embodiment.

Here, a tR prediction unit 40 will be briefly described using FIG. 24. As illustrated in FIG. 24, the NAND flash memory chip 10 includes a tR prediction unit 40. The tR prediction unit 40 includes any arithmetic circuit and a register. The tR prediction unit 40 predicts the tR with the any arithmetic circuit, and stores the prediction result in the register.

[S402]

The memory controller 20 issues the read command set to the NAND flash memory chip 10. This read command set is the command set specified in step S400.

When the read command set is received, the NAND flash memory chip 10 starts the sensing operation.

[S403]

The memory controller 20 starts measuring the elapsed time period from the issuance using the timer 22, together with the issuance of the command set in step S402.

[S404]

The memory controller 20 determines whether or not the elapsed time period from the issuance of the read command set (step S402) is equal to or greater than the sensing operation time period tR_est (that is, elapsed time period from S402 tR_est). When it is determined that the elapsed time period from step S402 is not equal to or greater than the sensing operation time period tR_est (NO in step S404), the memory controller 20 repeats step S404.

[S405]

When it is determined that the elapsed time period from step S402 is equal to or greater than the sensing operation time period tR_est (YES in step S404), the memory controller 20 issues the data transfer command set to the NAND flash memory chip 10. As a modification example, even when it is determined that the elapsed time period from step S402 is equal to or greater than the sensing operation time period tR_est, the memory controller 20 may further perform the status read on the NAND flash memory chip 10 just in case. By performing the status read, the memory controller 20 can know definitively that the NAND flash memory chip 10 is in the ready state and can cause the NAND flash memory chip 10 to receive the data transfer command set.

The NAND flash memory chip 10 can transfer the data read in the sensing operation to the memory controller 20 without delay.

4-2-2. Operation Sequence

Figure 25:
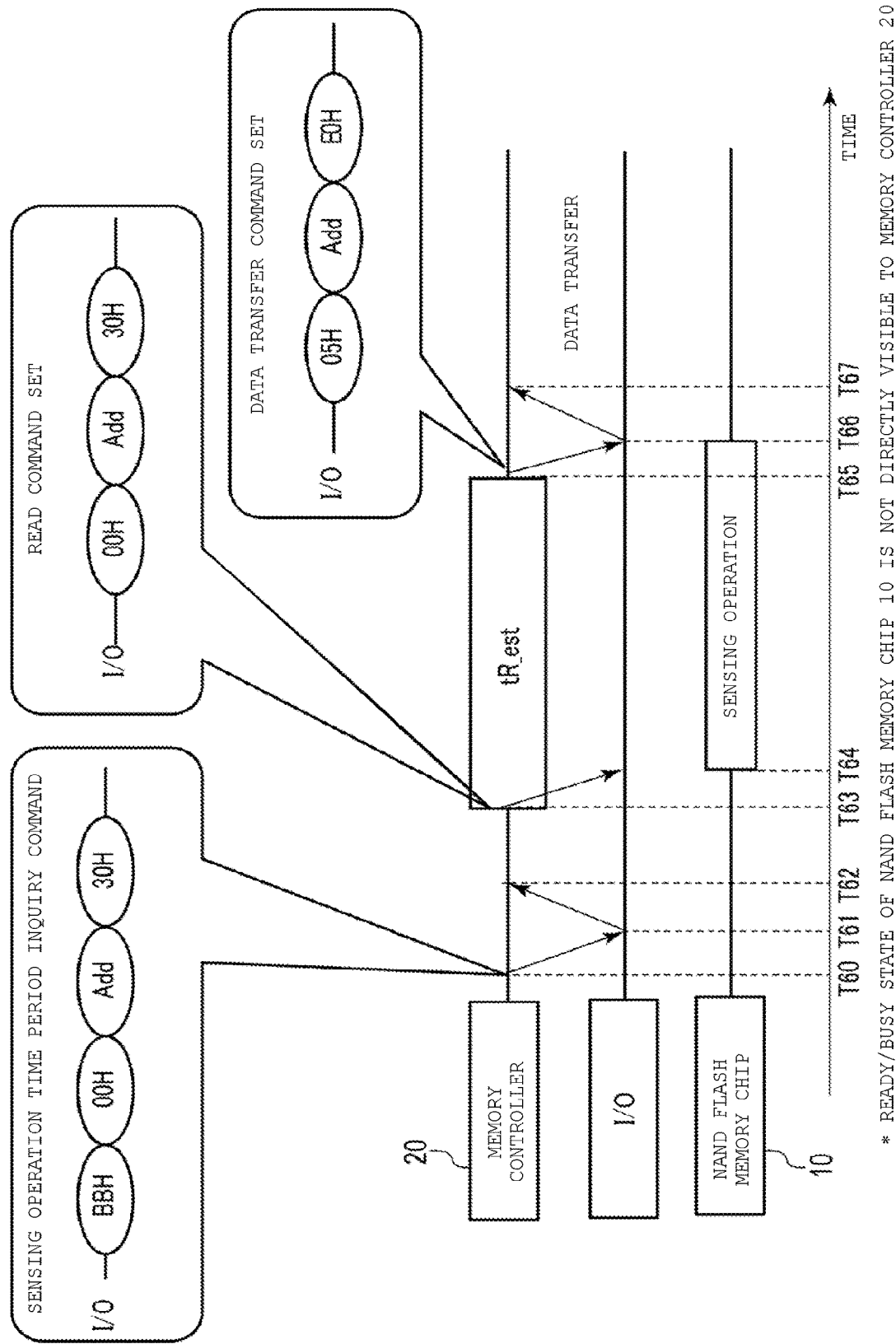
FIG. 25 is a timing diagram illustrating the read operation of the memory system according to the fourth embodiment.

An example of a sequence of the read operation of the fourth embodiment will be described with reference to FIG. 25.

At time T60, the memory controller 20 issues a sensing operation time period inquiry command (command set) to the NAND flash memory chip 10. The command set includes a command BBH for inquiring the sensing operation time period, and a read condition of the read command set scheduled to be issued.

At time T61, when the sensing operation time period inquiry command is received, the NAND flash memory chip 10 acquires the sensing operation time period tR_est from the tR prediction unit 40 based on the read condition in the sensing operation time period inquiry command (the sensing operation time period tR_est may be obtained by calculation). Then, the NAND flash memory chip 10 supplies the sensing operation time period tR_est to the memory controller 20.

At time T62, the memory controller 20 receives the sensing operation time period tR_est.

At time T63, the memory controller 20 issues, to the NAND flash memory chip 10, the read command set (the read command set of the same condition as the read condition inquired at time T60) scheduled to be issued. Then, the memory controller 20 starts measurement of an elapsed time period from the issuance of command using the timer 22, together with issuance of the read command set. In this embodiment, it is assumed that the memory controller 20 starts the sensing operation when the NAND flash memory chip 10 issues the read command.

At time T64, when the read command set is received, the NAND flash memory chip 10 starts the sensing operation.

The memory controller 20 waits for a period from time T63 to the sensing operation time period tR_est (that is, until the time T65). Then, the memory controller 20 issues the data transfer command set to the NAND flash memory chip 10.

At time T66 after the lapse of the sensing operation time period tR_est from time T64, the NAND flash memory chip 10 completes the sensing operation and is in a ready state where a command may be received. Then, at time T66, the NAND flash memory chip 10 receives the data transfer command set, and supplies the data read in the sensing operation to the memory controller 20.

At time T67, the memory controller 20 receives data from the NAND flash memory chip 10.

4-3. Effects

According to the embodiment described above, the memory controller 20 inquires about the sensing operation time period tR_est before issuing the read command set. With this configuration, the same effect as that of the first embodiment can be obtained.

5. Fifth Embodiment

A fifth embodiment will be described. In the fifth embodiment, a case where the solution 1(B-2) and solution 2(A) are adopted as a basic policy will be described. A basic configuration and basic operation of the device according to the fifth embodiment are the same as those of the devices according to the embodiments described above. Accordingly, the description of the matters described in the embodiments described above and the matters that can be easily analogized from the embodiments described above will be omitted.

5-1. Basic Policy

In the fifth embodiment, a case where the solution 1(B-2) and solution 2(A) are adopted as the basic policy will be described.

5-2. Read Operation of Fifth Embodiment

In the following, a read operation of the fifth embodiment will be described below.

5-2-1. Operation Flow

Figure 26:
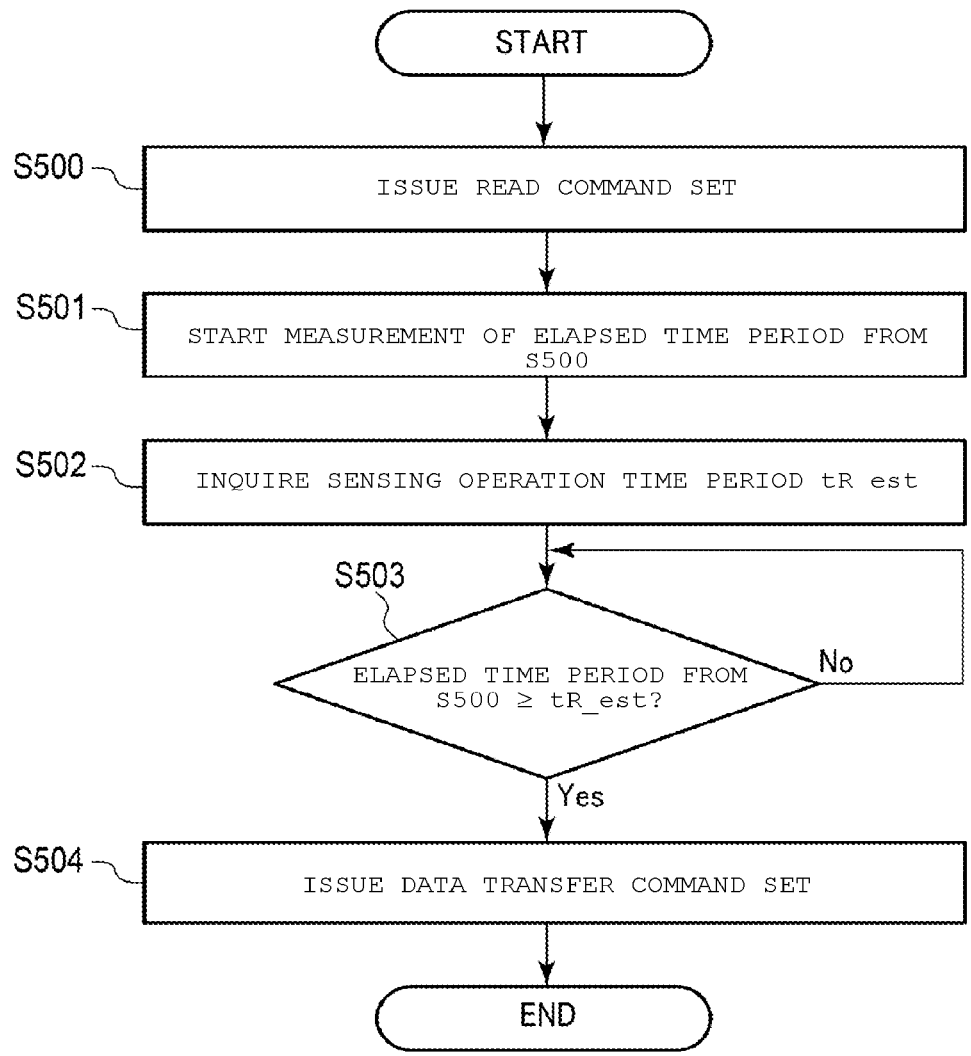
FIG. 26 is a flowchart illustrating a read operation of a memory system according to a fifth embodiment.

A flow of the read operation according to the fifth embodiment will be described with reference to FIG. 26.

[S500]

The memory controller 20 issues a read command set to the NAND flash memory chip 10.

When the read command set is received, the NAND flash memory chip 10 starts the sensing operation.

[S501]

The memory controller 20 starts measuring the elapsed time period from the issuance using the timer 22, together with the issuance of the command set in step S500.

[S502]

The memory controller 20 issues a sensing operation time period inquiry command (command set) for inquiring the sensing operation time period to the NAND flash memory chip 10.

When the sensing operation time period inquiry command is received from the memory controller 20, the NAND flash memory chip 10 acquires the sensing operation time period tR_est from the tR prediction unit 40 based on the read condition of the read command by which the sensing operation is currently performed. Then, the NAND flash memory chip 10 supplies the sensing operation time period tR_est to the memory controller 20.

[S503] and [S504]

Figure 23:
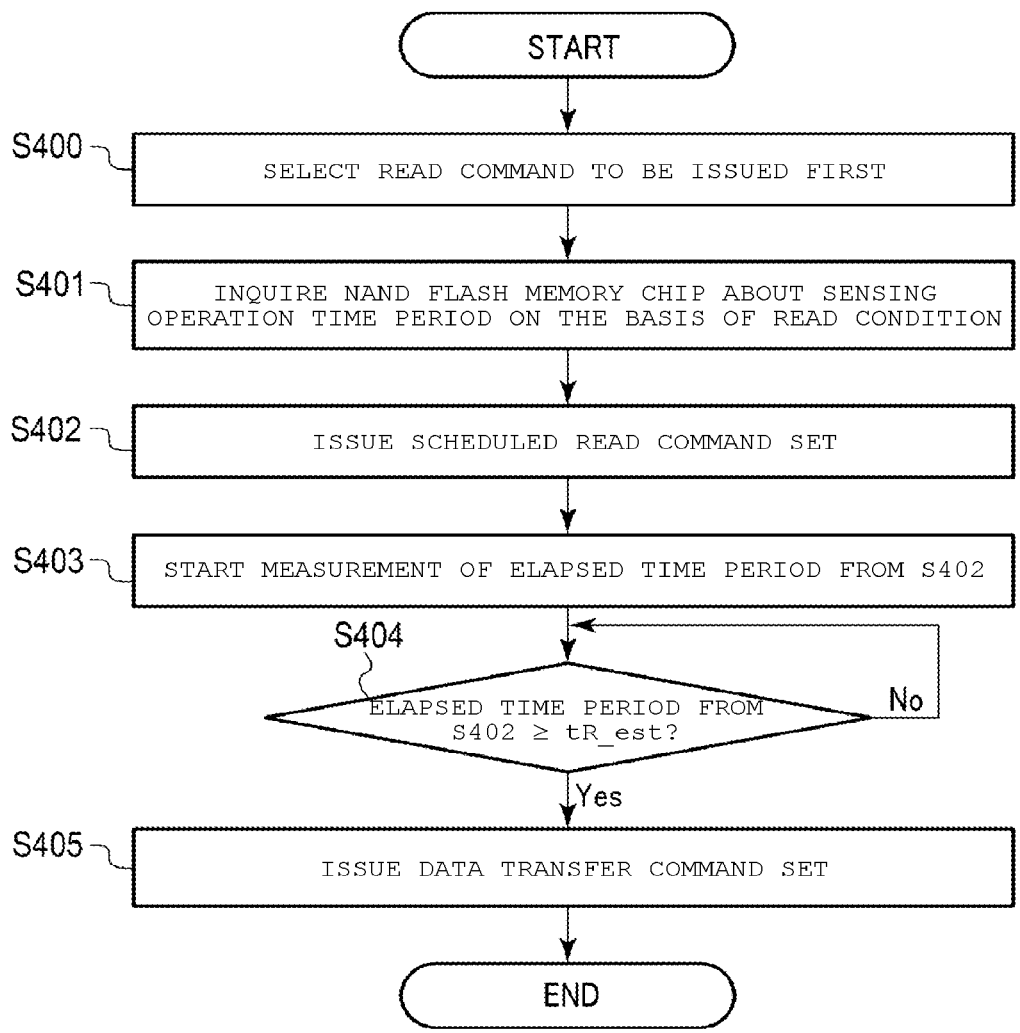
FIG. 23 is a flowchart illustrating a read operation of a memory system according to a fourth embodiment.

In Steps S503 and S504, the same operations as steps S404 and S405 in FIG. 23 are performed, respectively. As a modification example, even when it is determined that the elapsed time period from step S500 is equal to or greater than the sensing operation time period tR_est, the memory controller 20 may further perform the status read on the NAND flash memory chip 10 just in case. By performing the status read, the memory controller 20 can know definitively that the NAND flash memory chip 10 is in the ready state and can cause the NAND flash memory chip 10 to receive the data transfer command set.

5-2-2. Operation Sequence

Figure 27:
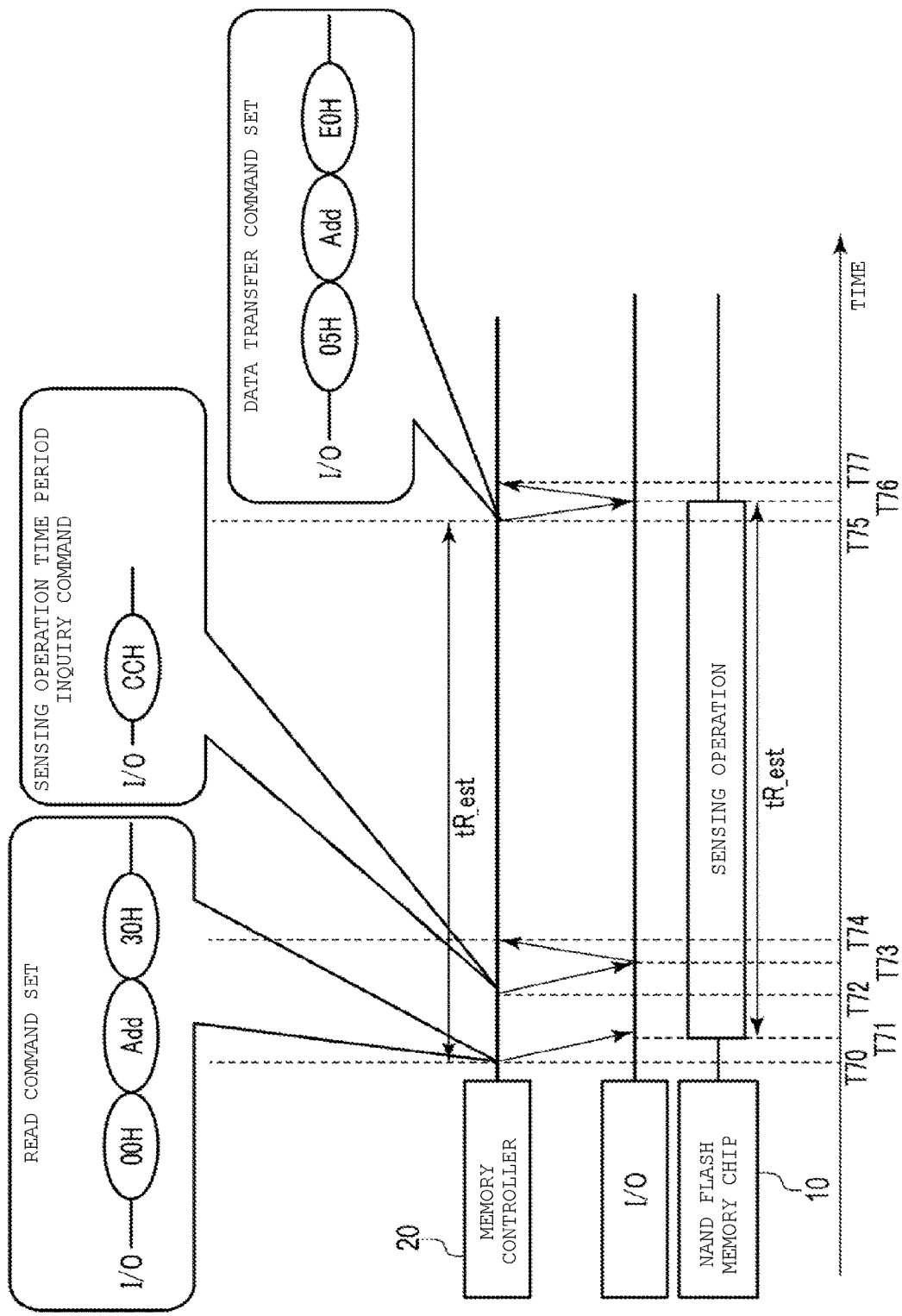
FIG. 27 is a timing diagram illustrating the read operation of the memory system according to the fifth embodiment.

A sequence of the read operation of the fifth embodiment will be described with reference to FIG. 27.

At time T70, the memory controller 20 issues a read command set to the NAND flash memory chip 10. Then, the memory controller 20 starts measuring the elapsed time period from the issuance using the timer 22, together with the issuance of the read command set. In this embodiment, it is assumed that the memory controller 20 starts the sensing operation when the NAND flash memory chip 10 issues the read command set.

At time T71, when the read command set is received, the NAND flash memory chip 10 starts the sensing operation.

At time T72, the memory controller 20 issues a sensing operation time period inquiry command to the NAND flash memory chip 10. This command set includes a command CCH for inquiring the sensing operation time period of the read command issued immediately before.

At time T73, when the sensing operation time period inquiry command is received, the NAND flash memory chip 10 acquires the sensing operation time period tR_est from the tR prediction unit 40 based on the read condition of the read command set issued immediately before. Then, the NAND flash memory chip 10 supplies the sensing operation time period tR_est to the memory controller 20.

At time T74, the memory controller 20 receives the sensing operation time period tR_est.

At time T75 after the lapse of the sensing operation time period tR_est from time T70, the memory controller 20 issues a data transfer command set to the NAND flash memory chip 10.

At time T76 after the lapse of the sensing operation time period tR_est from time T71, the NAND flash memory chip 10 ends the sensing operation. At time T76, when the data transfer command set is received, data read in the sensing operation is transferred to the memory controller 20.

At time T77, the memory controller 20 receives data from the NAND flash memory chip 10.

5-3. Effects

According to the embodiment described above, the memory controller 20 inquires about the sensing operation time period tR_est after issuing the read command set. With this configuration, the same effect as that of the first embodiment can be obtained.

6. Sixth Embodiment

A sixth embodiment will be described. In the sixth embodiment, a case of inquiring about the scheduled end time of the sensing operation will be described. A basic configuration and basic operation of the device according to the sixth embodiment are the same as those of the devices according to the embodiments described above, except that the memory controller does not need the tR table. Accordingly, the description of the matters described in the embodiments described above and the matters that can be easily analogized from the embodiments described above will be omitted.

6-1. Basic Policy

In each embodiment described above, the case of solving the problem 1 and the problem 2 described in FIG. 13 is described. In the sixth embodiment, a method will be described in which the completion of the sensing operation is estimated by inquiring of the NAND flash memory chip 10 about the scheduled end time of the sensing operation.

The solution 3 is a method of estimating the end time of the sensing operation by inquiring of the NAND flash memory chip 10 about the scheduled time of the end of the sensing operation. The solution 3 is for solving the problems 1 and 2 illustrated in FIG. 13.

6-2. Variations of Solution 3

In general, there are two possible methods for the memory controller 20 to inquire about the scheduled end time of the sensing operation.

6-2-1. Solution 3(A)

As a first variation (solution 3(A)) of the solution 3, the memory controller 20 inquires of the NAND flash memory chip 10 about the scheduled suspend time of an operation (for example, a program operation or an erase operation) before issuing the read command set. Then, the memory controller 20 waits until the scheduled suspend time of the operation (or after the scheduled suspend time of the operation), and then inquires of the NAND flash memory chip 10 about the scheduled end time of the sensing operation (an operation based on issuance of the read command set).

6-2-2. Solution 3(B)

As a second variation (solution 3(B)) of the solution 3, the memory controller 20 repeats the inquiry to the NAND flash memory chip 10 until the scheduled sensing operation end time is obtained.

In the sixth embodiment, a case where the solution 3(A) is adopted will be described.

6-2. Read Operation of Sixth Embodiment

The read operation after the cache program will be described with reference to FIG. 28.

[S600] to [S605]

Steps S600 to S606 are the same operations as steps S200 to S204 and S206 in FIG. 19, respectively.

[S606]

When it is determined that the current time is after the scheduled suspend time Tp acquired from the NAND flash memory chip 10 (YES in step S605), the memory controller 20 inquires of the NAND flash memory chip 10 about a scheduled end time T_read_end of the sensing operation of the read command issued in step S603. This inquiry is made by a sensing operation scheduled-end-time inquiry command (a status read request as an example). Then, the memory controller 20 determines whether or not the scheduled end time T_read_end of the sensing operation is acquired. The scheduled end time T_read_end of the sensing operation is stored in the status register 15A in the NAND flash memory chip 10, for example, after the start of the sensing operation. When the sensing operation scheduled-end-time inquiry command (for example, status read request) is received, the NAND flash memory chip 10 supplies the scheduled end time T_read_end of the sensing operation, which is being operated and stored in the status register 15A, to the memory controller 20. When the sensing operation is not started yet, the NAND flash memory chip 10 returns the fact that the sensing operation is not started to the memory controller 20.

When a read command set is received during the cache program, the NAND flash memory chip 10 cannot reliably predict the scheduled suspend time of the cache program. The timing for entering the cache ready state may change dynamically because it depends on a write state of the memory cell. For that reason, it is conceivable that the NAND flash memory chip 10 notifies the memory controller 20 of the rough reference time, and the memory controller 20 checks the ready/busy state of the NAND flash memory chip 10 using the status read command when the reference time is reached. On the other hand, in some embodiments, the NAND flash memory chip 10 responds to the memory controller 20 that "it is not determined" when the scheduled suspend time can be reliably predicted, and the memory controller 20 repeats the inquiry until the scheduled suspend time is obtained.

[S607]

After step S606, the memory controller 20 determines whether the sensing operation is started. For example, when the fact that the sensing operation is not started yet is received from the NAND flash memory chip 10, that is, when it is determined that the sensing operation is not started (NO in step S607), the memory controller 20 repeats the step S606.

[S608]

When it is determined that the sensing operation is started (YES in step S607), the memory controller 20 determines whether or not the current time is after the scheduled end time T_read_end of the sensing operation. When it is determined that the current time is not after the scheduled end time T_read_end of the sensing operation (NO in step S608), the memory controller 20 repeats step S608.

[S609]

When it is determined that the current time is after the scheduled end time T_read_end of the sensing operation (YES in step S608), the memory controller 20 issues a data transfer command set to the NAND flash memory chip 10. As a modification example, even when it is determined that the current time is after scheduled end time T_read_end of the sensing operation, the memory controller 20 may further perform the status read on the NAND flash memory chip 10 just in case. By performing this status read, the memory controller 20 can know definitively that the NAND flash memory chip 10 is in the ready state, and can cause the NAND flash memory chip 10 to receive the data transfer command set.

By the process as described above, the NAND flash memory chip 10 can transfer the data read in the sensing operation to the memory controller 20 without delay.

6-3. Effects

In the embodiment described above, the same effect as that of the first embodiment can be obtained by inquiring the scheduled end time of the sensing operation.

7. Seventh Embodiment

A seventh embodiment will be described. In the seventh embodiment, a case where a solution 3(B) is adopted will be described. A basic configuration and basic operation of the device according to the seventh embodiment are the same as those of the devices according to the embodiments described above, except that the memory controller does not need the tR table. Accordingly, the description of the matters described in the embodiments described above and the matters that can be easily analogized from the embodiments described above will be omitted.

7-1. Basic Policy

In this embodiment, the solution 3(B) described in the sixth embodiment is adopted.

7-2. Read Operation of Seventh Embodiment

Figure 29:
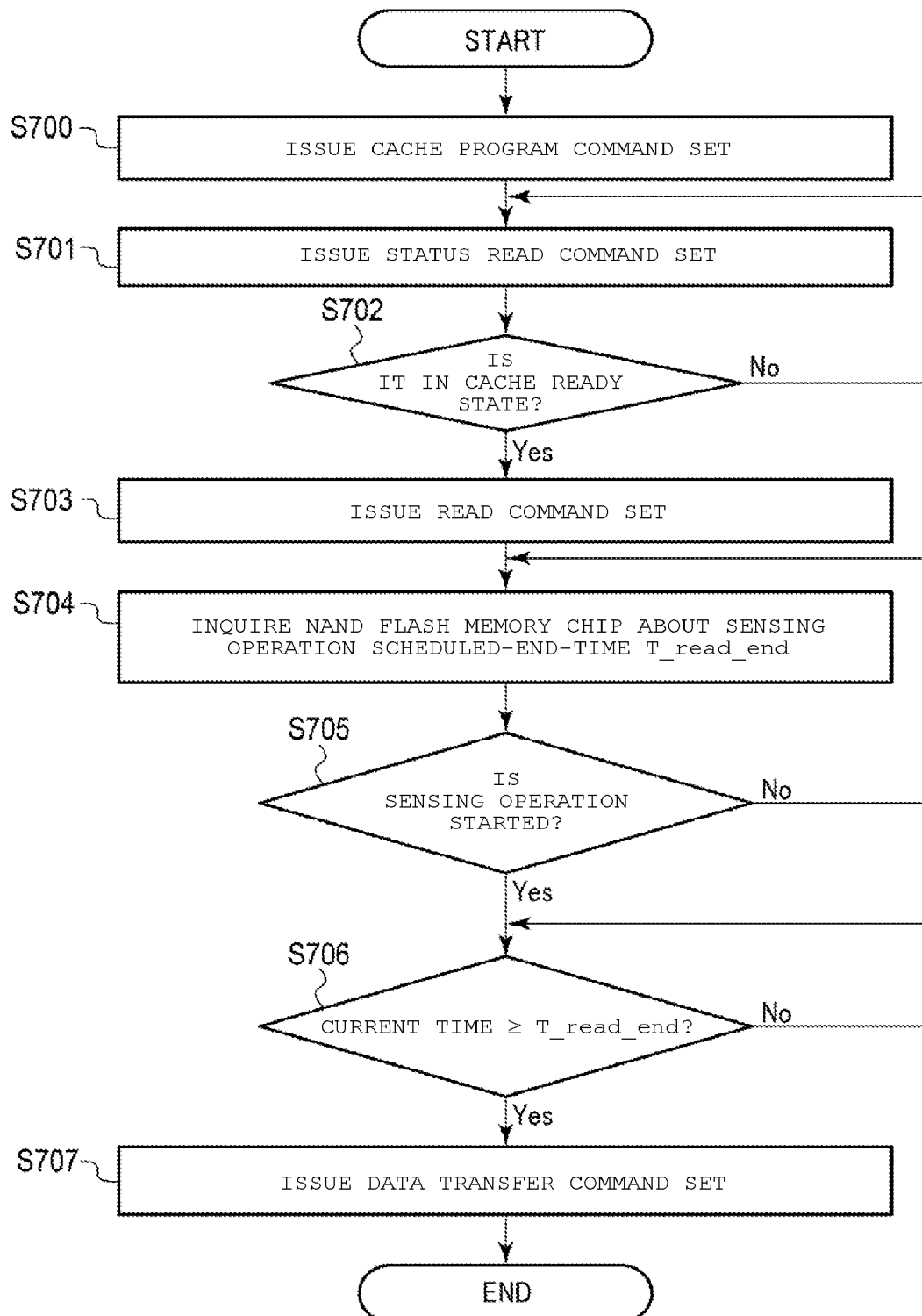
FIG. 29 is a flowchart illustrating a read operation of a memory system according to a seventh embodiment.

The read operation after the cache program will be described with reference to FIG. 29.

[S700] to [S703]

Figure 21:
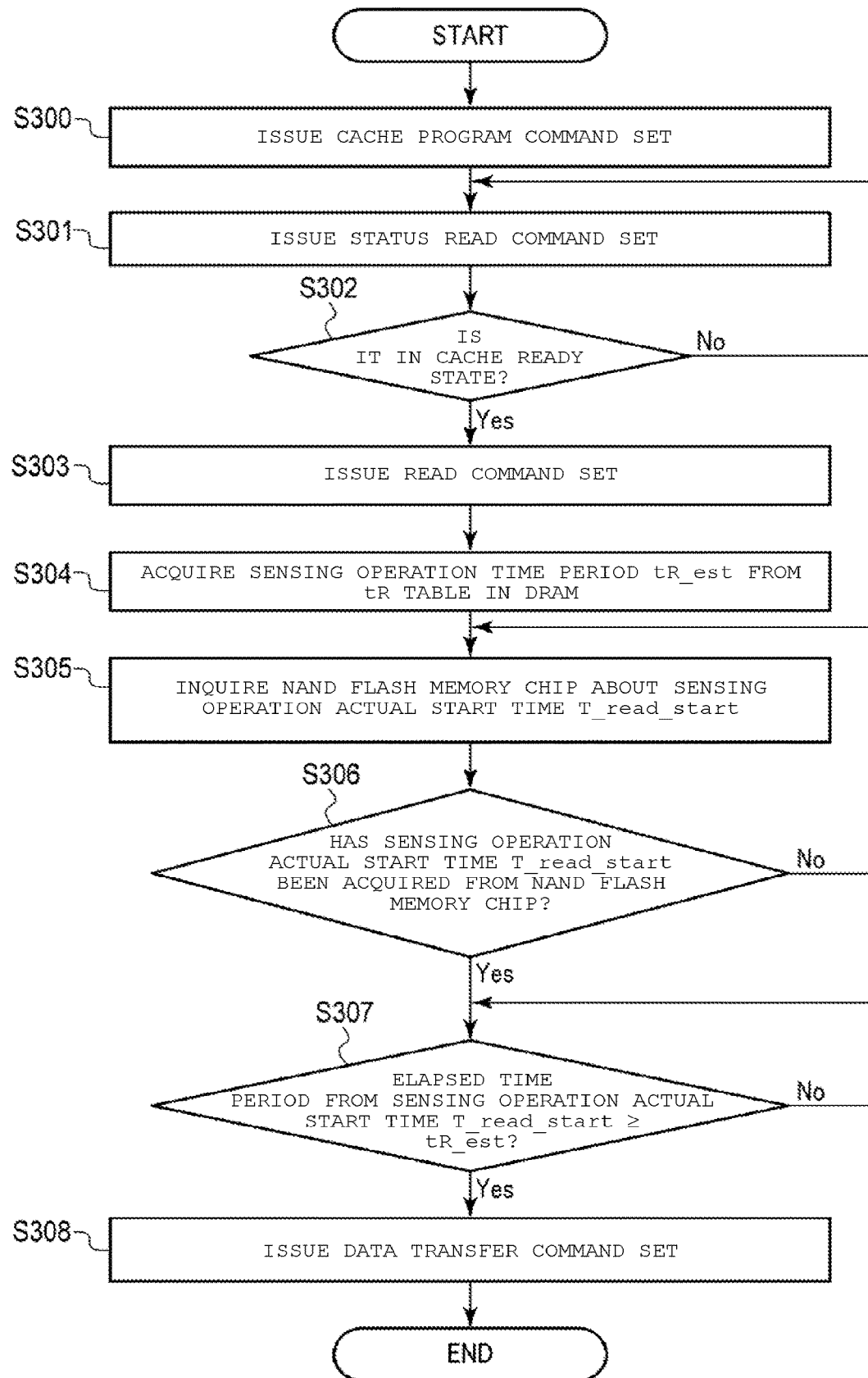
FIG. 21 is a flowchart illustrating a read operation of a memory system according to a third embodiment.

Steps S700 to S703 are the same operations as steps S300 to S303 in FIG. 21, respectively.

[S704]

The memory controller 20 issues a sensing operation scheduled-end-time inquiry command (as an example, a status read request), which inquires about the scheduled end time T_read_end of the sensing operation, to the NAND flash memory chip 10.

When the sensing operation is started, the NAND flash memory chip 10 stores the scheduled end time T_read_end of the sensing operation in the status register 15A. Then, in response to the inquiry from the memory controller 20, the NAND flash memory chip 10 supplies the scheduled end time T_read_end of the sensing operation stored in the status register 15A to the memory controller 20. When the sensing operation is not started, the fact the sensing operation is not started is returned.

[S705]

The memory controller 20 receives the scheduled end time of the sensing operation T_read_end from the NAND flash memory chip 10, and determines whether the sensing operation is started.

When it is determined that the sensing operation is not started (NO in step S705), the memory controller 20 repeats step S704.

[S706]

When the scheduled end time T_read_end of the sensing operation is acquired (YES in step S705), the memory controller 20 determines whether or not the current time is after the scheduled ending time T_read_end of the sensing operation. When it is determined that the current time is not after the scheduled end time T_read_end of the sensing operation (NO in step S706), the memory controller 20 repeats step S706.

[S707]

When it is determined that the current time is after the scheduled end time T_read_end of the sensing operation (YES in step S706), the memory controller 20 issues the data transfer command set to the NAND flash memory chip 10. As a modification example, even when it is determined the current time is after the scheduled end time T_read_end of the sensing operation, the memory controller 20 may further perform the status read on the NAND flash memory chip 10 just in case. By performing the status read, the memory controller 20 can know definitively that the NAND flash memory chip 10 is in the ready state and can cause the NAND flash memory chip 10 to receive the data transfer command set.

The NAND flash memory chip 10 can transfer the data read in the sensing operation to the memory controller 20 without delay.

7-3. Effects

In the embodiment described above, the same effects as those of the first embodiment can be obtained by inquiring the scheduled end time of the sensing operation.

8. Eighth Embodiment

An eighth embodiment will be described. In the eighth embodiment, a case of inquiring the scheduled end time of the sensing operation will be described. A basic configuration and basic operation of the device according to the eighth embodiment are the same as those of the devices according to the sixth embodiment described above, except that the cache program is not performed. Accordingly, the description of the matters described in the sixth embodiment described above and the matters that can be easily analogized from the sixth embodiment described above will be omitted.

8-1. Basic Policy

In the eighth embodiment, a method of estimating the completion of the sensing operation by inquiring of the NAND flash memory chip 10 about the scheduled end time of the sensing operation will be described. In the eighth embodiment, the solution 3 is adopted.

8-2. Read Operation of Eighth Embodiment

Figure 30:
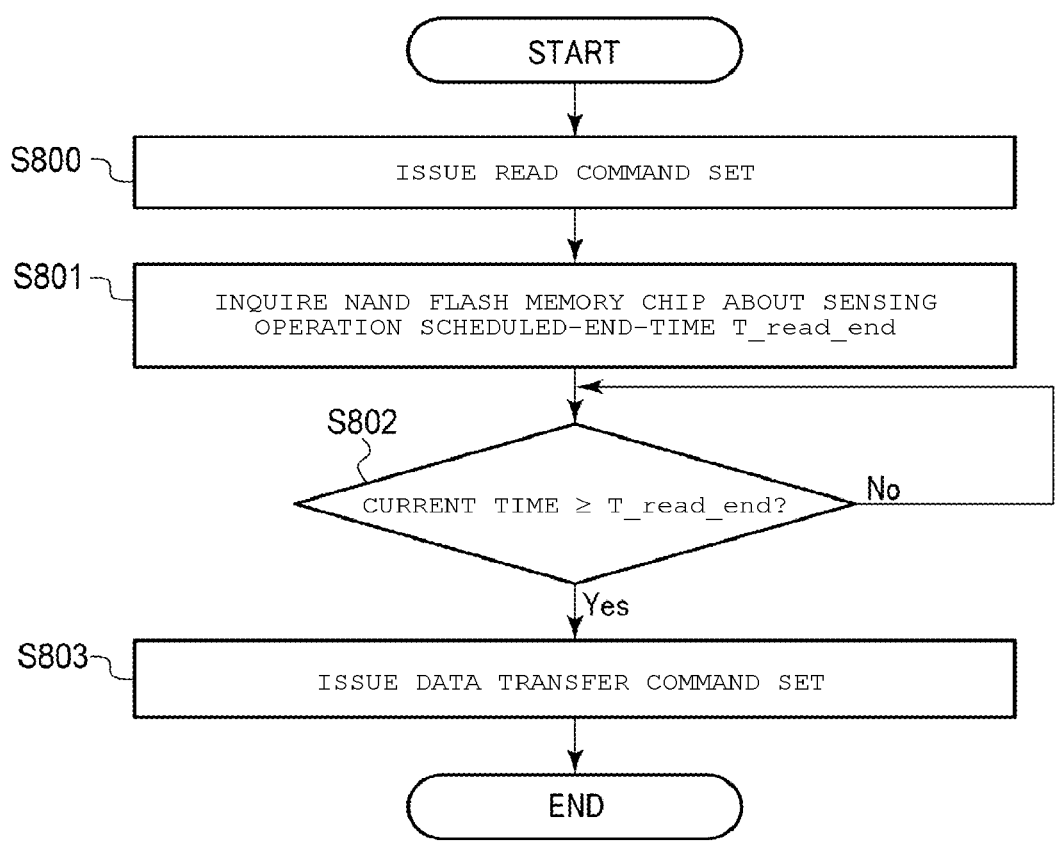
FIG. 30 is a flowchart illustrating a read operation of a memory system according to an eighth embodiment.

A flow of a read operation of the eighth embodiment will be described with reference to FIG. 30.

[S800]

The memory controller 20 issues a read command set to the NAND flash memory chip 10. When the read command set is received, the NAND flash memory chip 10 starts the sensing operation.

[S801] to [S803]

Figure 28:
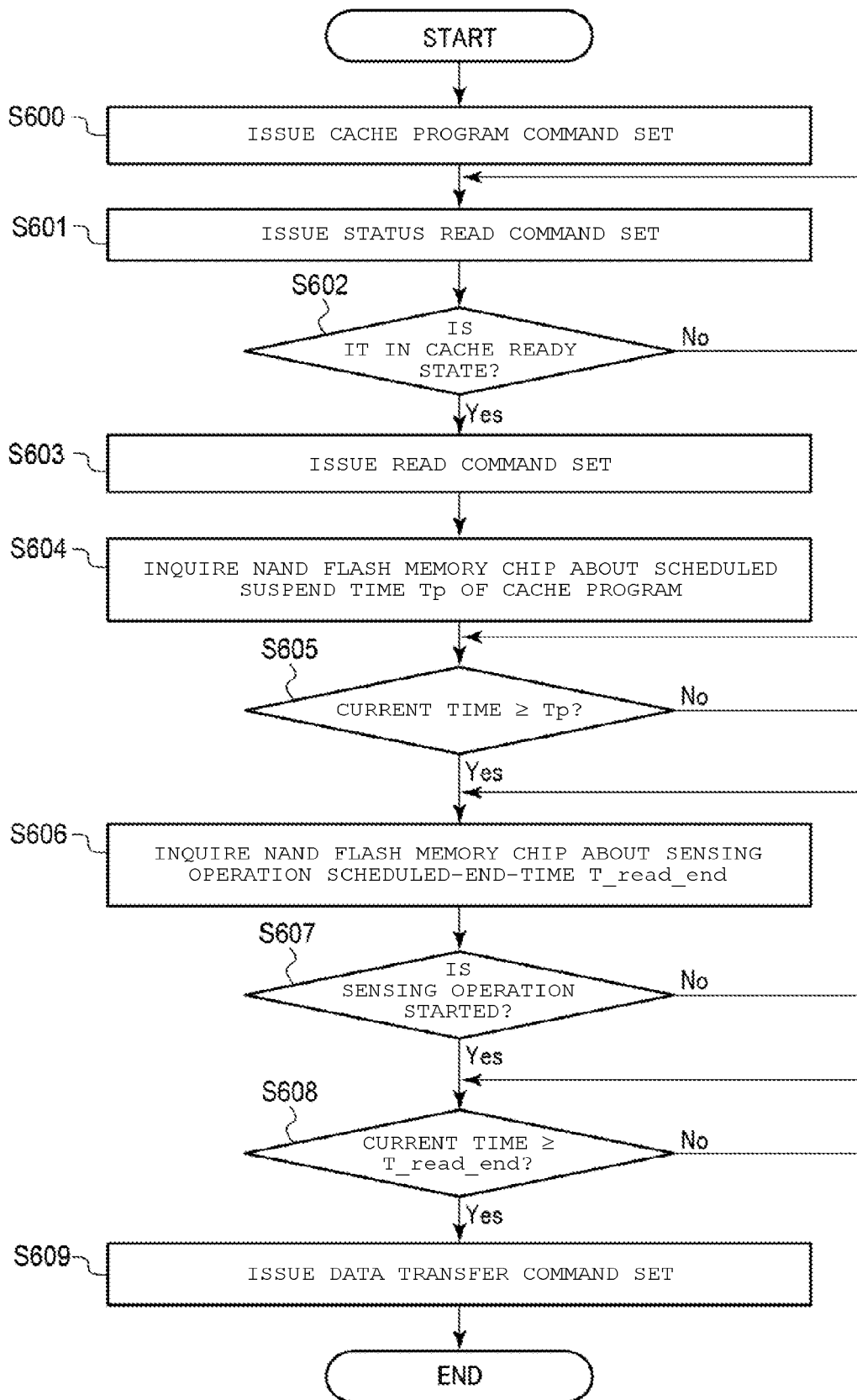
FIG. 28 is a flowchart illustrating a read operation of a memory system according to a sixth embodiment.

Steps S801 to S803 are the same operations as steps S606, S608, and S609 in FIG. 28, respectively.

By the process as described above, the NAND flash memory chip 10 can transfer the data read in the sensing operation to the memory controller 20 without delay.

8-3. Effects

In the embodiment described above, the same effects as those of the fifth embodiment and the sixth embodiment can be obtained by inquiring the scheduled end time of the sensing operation.

9. Others

In the embodiments described above, the completion of the program operation or the erase operation is detected by the status read command or by monitoring the ready/busy signal.

The sensing operation is completed in a fixed (constant) time period in principle. On the other hand, the program operation and the erase operation vary in the operation time period depending on a state of the memory cell. Ease of programming and erasing of the memory cell depends on the characteristics of the cell and the state of the cell. For that reason, during programming, the NAND flash memory chip 10 passes program verify (an operation to check whether the memory cell of a programming target is reached a predetermined threshold voltage by the program) or repeats a program loop until a predetermined number of program loops (a set of a program operation and a program verify operation) is reached. During erasing, the NAND flash memory chip 10 passes erase verify (an operation to check whether or not the erase passes) or repeats an erase loop until a predetermined number of erase loops (a set of an erase operation and an erase verify operation) is reached. That is, the time period required for programming and the time period required for erasing vary dynamically according to the characteristics and state of the cell. Accordingly, in each embodiment described above, the completion of the program operation or the erase operation is detected not by waiting for a predetermined time period but by a check by issuance of the status read command or monitoring of the ready/busy signal.

The memory controller 20 may simultaneously issue a command for inquiring the sensing operation time period and a command for inquiring the actual start time of the sensing operation. Specifically, in the operation flow of FIG. 19, the memory controller 20 does not perform step S205 (acquisition of sensing operation time period tR_est), and at the time of step S207 (inquiry about actual start time of the sensing operation), issues a command set for inquiring the sensing operation time period tR_est and the actual start time T_read_start of the sensing operation to the NAND flash memory chip 10. With this configuration, the NAND flash memory chip 10 supplies the sensing operation time period tR_est and the actual start time T_read_start of the sensing operation to the memory controller 20. Even in this case, the same effects as those of the embodiments described above can be obtained. The NAND flash memory chip 10 may supply the scheduled end time T_read_end of the sensing operation instead of the sensing operation time period tR_est and the actual start time T_read_start of the sensing operation.

Similarly, in the operation flow of FIG. 21, the memory controller 20 may not perform step S304 (acquisition of the sensing operation time period tR_est), and at the time of step S305 (acquisition of the actual start time T_read_start of the sensing operation), may issue a command set for inquiring the sensing operation time period tR_est and the actual start time T_read_start of the sensing operation to the NAND flash memory chip 10. With this configuration, the NAND flash memory chip 10 supplies the sensing operation time period tR_est and the actual start time T_read_start of the sensing operation to the memory controller 20. Even in this case, the same effects as those of the embodiments described above can be obtained. The NAND flash memory chip 10 may supply the scheduled end time T_read_end of the sensing operation instead of the sensing operation time period tR_est and the actual start time T_read_start of the sensing operation.

Figure 31:
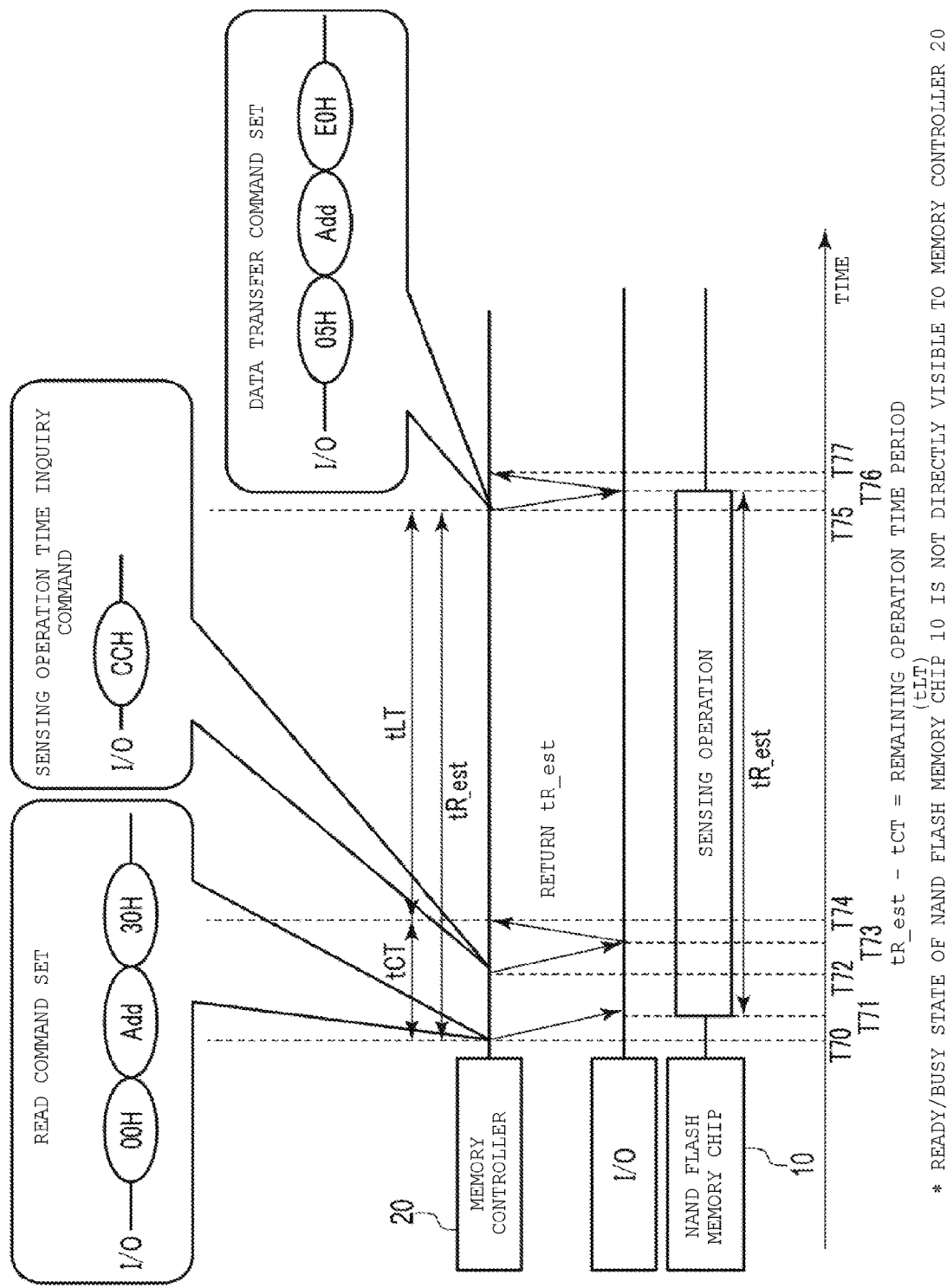
FIG. 31 is a timing diagram illustrating a read operation of a memory system according to a modification example.

The memory controller 20 may issue a data transfer command set in consideration of the time period from the issuance of the read command set to the reception of the sensing operation time period tR_est. Specifically, as illustrated in FIG. 31, the time period from the issuance of the read command set to the reception of the sensing operation time period tR_est is tCT (equal to the time period between time T70 and time T74). The memory controller 20 measures the time period tCT using the timer 22. The memory controller 20 regards time T70 at which the read command set is issued as the sensing operation start time. Accordingly, the memory controller 20 may set time period tLT obtained by subtracting the time period tCT from the sensing operation time period tR_est as wait time period from reception of the sensing operation time period tR_est to the issuance of data transfer command set to the NAND flash memory chip 10.

In each embodiment described above, the difference due to the word line address is not taken into consideration for the tR. However, the characteristics of the memory cell may vary for each word line. Taking this variation into consideration, the sense time period tR may be different for each word line. In this case, the read condition may include a word line address, and the sensing operation time period tR_est may be determined based on the word line address. The word line address is included in the page address of the read condition.

Each embodiment described above may be applied even when the NAND flash memory chip 10 is provided with a plurality of planes. The plane is a set including the memory cell array 11, the sense amplifier module 12, and the row decoder module 13. When a plurality of planes of the NAND flash memory chip 10 can operate in parallel, the core ready/core busy state and cache ready/cache busy state described above may be defined for each plane.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory device that includes:
a control circuit;
a data latch; and
a nonvolatile memory cell array, and
a memory controller configured to:
issue a first instruction to the memory device to cause the control circuit to execute a first operation; and
determine, according to a type of the first operation, whether to check a status of the memory device indicating whether the first operation has completed, before issuing a second instruction to the memory device.

2. The memory system according to claim 1, wherein the memory controller is configured to:
upon determining that the first operation is a program operation, the program operation being an operation in which the control circuit programs data from the data latch into the nonvolatile memory cell array,
determine to check, before issuing the second instruction, the status of the memory device indicating whether the program operation has completed; and
issue the second instruction to the memory device after checking the status of the memory device.

3. The memory system according to claim 1, wherein the memory controller is configured to:
upon determining that the first operation is a sense operation, the sense operation being an operation in which the control circuit reads data stored in the nonvolatile memory cell array into the data latch,
determine not to check, before issuing a transfer instruction as the second instruction, the status of the memory device indicating whether the sense operation has completed; and
issue the transfer instruction to the memory device, without checking the status of the memory device, to cause the control circuit to execute a transfer operation in which the control circuit transfers the data from the data latch to the memory controller.

4. The memory system according to claim 1, wherein the memory controller is further configured to:
  issue a sense instruction to the memory device, as the first instruction, to cause the control circuit to execute a sense operation in which the control circuit reads data stored in the nonvolatile memory cell array to the data latch;
  obtain information about an operation period of the sense operation; and
  issue, on the basis of the obtained operation period, a transfer instruction as the second instruction to the memory device to cause the control circuit to execute a transfer operation in which the control circuit transfers the data from the data latch to the memory controller.

5. The memory system according to claim 4, wherein the memory controller is further configured to:
  determine whether time has elapsed for the obtained operation period since having issued the sense instruction; and
  issue the transfer instruction to the memory device, without checking the status of the memory device.

6. The memory system according to claim 1, wherein the memory device further includes a storage circuit that stores information about an operation period of a sense operation, the sense operation being an operation in which the control circuit reads data stored in the nonvolatile memory cell array to the data latch.

7. The memory system according to claim 6, wherein the memory controller is further configured to:
  obtain, from the memory device, the information about the operation period of the sense operation before issuing a sense instruction as the first instruction;
  determine whether time has elapsed for the obtained operation period since having issued the sense instruction; and
  issue a transfer instruction as the second instruction to the memory device without checking the status of the memory device, the transfer instruction being an instruction to cause the control circuit to execute a transfer operation in which the control circuit transfers the data from the data latch to the memory controller.

8. The memory system according to claim 6, wherein the memory controller is further configured to inquire the memory device about the operation period of the sense operation before or after issuing a sense instruction as the first instruction.

9. The memory system according to claim 8, wherein the memory controller is configured to designate a read condition of the sense operation, when inquiring about the operation period of the sense operation.

10. The memory system according to claim 9, wherein the read condition includes at least one of (A) a type of read method, (B) a type of storage method, and (C) a page type.

11. A method of controlling a memory device, the memory device including a control circuit, a data latch, and a nonvolatile memory cell array, said method comprising:
  issuing a first instruction to the memory device to cause the control circuit to execute a first operation; and
  determining, according to a type of the first operation, whether to check a status of the memory device indicating whether the first operation has completed, before issuing a second instruction to the memory device.

12. The method according to claim 11, further comprising:
  upon determining that the first operation is a program operation, the program operation being an operation in which the control circuit programs data from the data latch into the nonvolatile memory cell array,
  determining to check, before issuing the second instruction, the status of the memory device indicating whether the program operation has completed; and
  issuing the second instruction to the memory device after checking the status of the memory device.

13. The method according to claim 11, further comprising:
  upon determining that the first operation is a sense operation, the sense operation being an operation in which the control circuit reads data stored in the nonvolatile memory cell array into the data latch,
  determining not to check, before issuing a transfer instruction as the second instruction, the status of the memory device indicating whether the sense operation has completed; and
  issuing the transfer instruction to the memory device, without checking the status of the memory device, to cause the control circuit to execute a transfer operation in which the control circuit transfers the data from the data latch to the memory controller.

14. The method according to claim 11, further comprising:
  issuing a sense instruction to the memory device, as the first instruction, to cause the control circuit to execute a sense operation in which the control circuit reads data stored in the nonvolatile memory cell array to the data latch;
  obtaining information about an operation period of the sense operation; and
  issuing, on the basis of the obtained operation period, a transfer instruction as the second instruction to the memory device to cause the control circuit to execute a transfer operation in which the control circuit transfers the data from the data latch to the memory controller.

15. The method according to claim 14, further comprising:
  determining whether time has elapsed for the obtained operation period since having issued the sense instruction; and
  issuing the transfer instruction to the memory device, without checking the status of the memory device.

16. The method according to claim 11, wherein
  the memory device further includes a storage circuit that stores information about an operation period of a sense operation, the sense operation being an operation in which the control circuit reads data stored in the nonvolatile memory cell array to the data latch.

17. The method according to claim 16, further comprising:
  obtaining, from the memory device, the information about the operation period of the sense operation before issuing a sense instruction as the first instruction;
  determining whether time has elapsed for the obtained operation period since having issued the sense instruction; and
  issuing a transfer instruction as the second instruction to the memory device without checking the status of the memory device, the transfer instruction being an instruction to cause the control circuit to execute a transfer operation in which the control circuit transfers the data from the data latch to the memory controller.

18. The method according to claim 16, further comprising:
  inquiring the memory device about the operation period of the sense operation before or after issuing a sense instruction as the first instruction.

19. The method according to claim 18, further comprising:
  designating a read condition of the sense operation, when inquiring about the operation period of the sense operation.

20. The method according to claim 19, wherein
  the read condition includes at least one of (A) a type of read method, (B) a type of storage method, and (C) a page type.

* * * * *